US012387772B2

(12) United States Patent
Huang et al.

(10) Patent No.: US 12,387,772 B2
(45) Date of Patent: Aug. 12, 2025

(54) STRUCTURE AND METHOD FOR MRAM DEVICES WITH A SLOT VIA

(71) Applicant: Taiwan Semiconductor Manufacturing Co., Ltd., Hsin-Chu (TW)

(72) Inventors: Chih-Fan Huang, Kaohsiung (TW); Hsiang-Ku Shen, Hsinchu (TW); Liang-Wei Wang, Hsinchu (TW); Dian-Hau Chen, Hsinchu (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 830 days.

(21) Appl. No.: 17/322,560

(22) Filed: May 17, 2021

(65) Prior Publication Data

US 2022/0044717 A1 Feb. 10, 2022

Related U.S. Application Data

(60) Provisional application No. 63/063,783, filed on Aug. 10, 2020.

(51) Int. Cl.
  *G11C 11/16* (2006.01)
  *H01L 23/522* (2006.01)
  (Continued)

(52) U.S. Cl.
  CPC ........ *G11C 11/161* (2013.01); *H01L 23/5226* (2013.01); *H10B 61/00* (2023.02);
  (Continued)

(58) Field of Classification Search
  CPC ...... H10B 61/00; H10B 61/22; G11C 11/161; H10N 50/80; H10N 50/01; H10N 50/85; H10N 50/10; H01L 23/5226
  See application file for complete search history.

(56) References Cited

U.S. PATENT DOCUMENTS

| 6,873,535 | B1 | 3/2005 | Wang et al. |
| 6,946,698 | B1 | 9/2005 | Lin |

(Continued)

FOREIGN PATENT DOCUMENTS

| JP | 2007158301 A | 6/2007 |
| KR | 20120025523 A | 3/2012 |

(Continued)

OTHER PUBLICATIONS

Hsiang-Ku Shen et al., "Semiconductor Memory Device and Method of Forming the Same", U.S. Appl. No. 16/998,911, filed Aug. 20, 2020, Assignee: Taiwan Semiconductor Manufacturing Co., Ltd., 22 pages specification, 20 pages drawings.

*Primary Examiner* — Antonio B Crite
(74) *Attorney, Agent, or Firm* — HAYNES AND BOONE, LLP

(57) ABSTRACT

A semiconductor structure includes a third metal layer immediately above a second metal layer that is over a first metal layer. The second metal layer includes magnetic tunneling junction (MTJ) devices in a memory region and a first conductive feature in a logic region. Each MTJ device includes a bottom electrode and an MTJ stack over the bottom electrode. The third metal layer includes a first via electrically connecting to the first conductive feature, and a slot via over and electrically connecting to the MTJ stack of the MTJ devices. The slot via occupies space extending continuously and laterally from a first one to a last one of the MTJ devices. The first via is as thin as or thinner than the slot (Continued)

via. The third metal layer further includes second and third conductive features electrically connecting to the first via and the slot via, respectively.

20 Claims, 32 Drawing Sheets

(51) Int. Cl.
  *H10B 61/00* (2023.01)
  *H10N 50/01* (2023.01)
  *H10N 50/10* (2023.01)
  *H10N 50/80* (2023.01)
  *H10N 50/85* (2023.01)
(52) U.S. Cl.
  CPC ............ *H10B 61/22* (2023.02); *H10N 50/01* (2023.02); *H10N 50/10* (2023.02); *H10N 50/80* (2023.02); *H10N 50/85* (2023.02)

(56) References Cited

U.S. PATENT DOCUMENTS

| | | |
|---|---|---|
| 7,099,176 B2 | 8/2006 | Tang et al. |
| 7,170,775 B2 | 1/2007 | Tang et al. |
| 8,709,956 B2 | 4/2014 | Satoh et al. |
| 9,818,935 B2 | 11/2017 | Chuang et al. |
| 10,056,543 B2 | 8/2018 | Bak et al. |
| 10,270,025 B2 | 4/2019 | Chuang et al. |
| 10,297,750 B1 | 5/2019 | Ando et al. |
| 2007/0023806 A1 | 2/2007 | Gaidis et al. |
| 2012/0306033 A1 | 12/2012 | Satoh et al. |
| 2017/0170386 A1 | 6/2017 | Chuang |
| 2018/0108832 A1* | 4/2018 | Chuang ................. H10N 50/80 |
| 2019/0165258 A1 | 5/2019 | Peng et al. |
| 2019/0371996 A1 | 12/2019 | Chuang |
| 2020/0075669 A1 | 3/2020 | Chuang et al. |
| 2020/0098978 A1 | 3/2020 | Liao |
| 2020/0106008 A1 | 4/2020 | Peng |
| 2020/0119088 A1 | 4/2020 | Hashemi et al. |
| 2020/0176041 A1 | 6/2020 | Shen |
| 2020/0251649 A1 | 8/2020 | Sung |
| 2021/0074907 A1* | 3/2021 | Wang ..................... H10N 50/80 |

FOREIGN PATENT DOCUMENTS

| | | |
|---|---|---|
| KR | 20190135903 A | 12/2019 |
| KR | 20200037058 | 4/2020 |
| TW | 201729414 A | 8/2017 |
| TW | 201806114 A | 2/2018 |
| WO | 2010132773 A1 | 11/2010 |

* cited by examiner

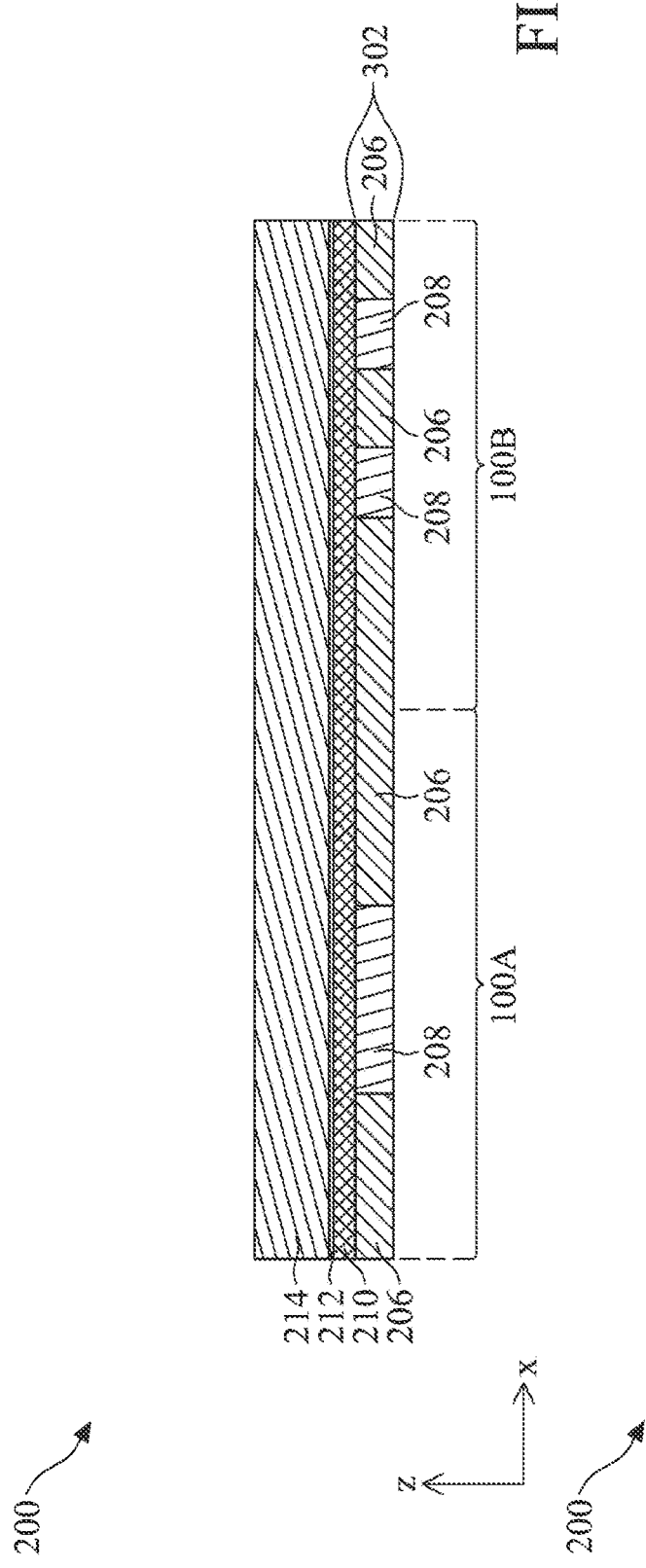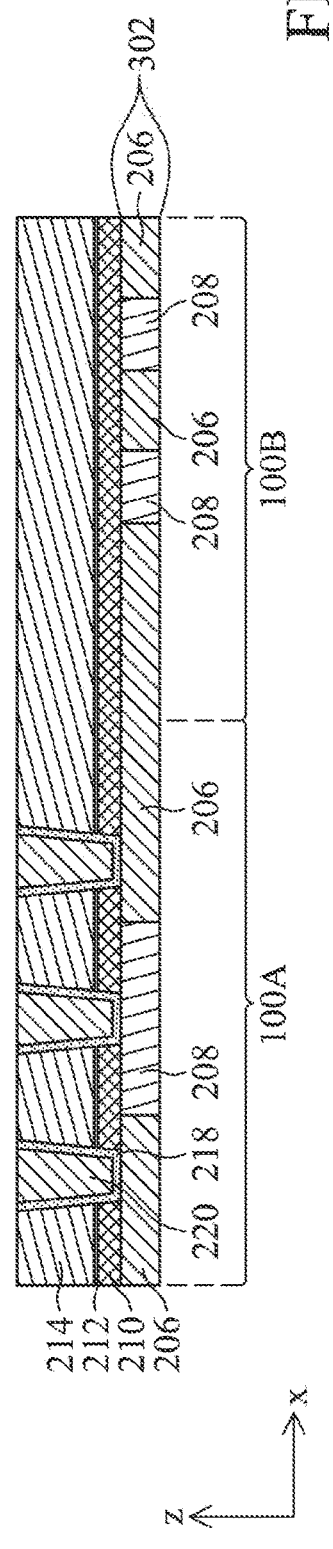
FIG. 3A
FIG. 3B

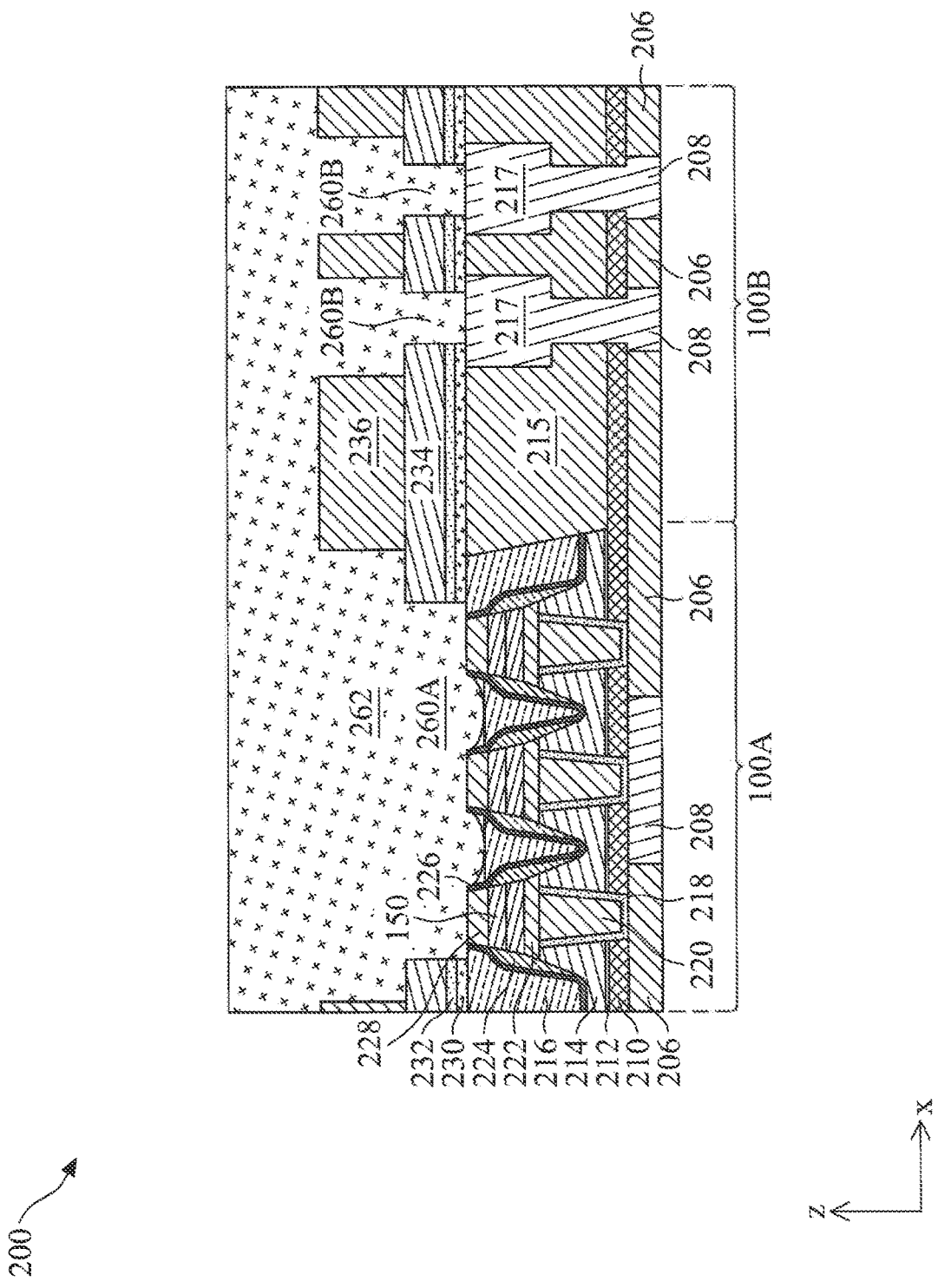

STRUCTURE AND METHOD FOR MRAM DEVICES WITH A SLOT VIA

PRIORITY

This application claims the priority to and the benefits of U.S. Provisional Application Ser. No. 63/063,783, filed Aug. 10, 2020, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and in particular to magnetic random-access memory (MRAM). MRAM offers comparable performance to volatile static random-access memory (SRAM) and comparable density with lower power consumption to volatile dynamic random access memory (DRAM). Compared to NVM Flash memory, MRAM may offer faster access times and suffer less degradation over time. An MRAM cell is formed by a magnetic tunneling junction (MTJ) comprising two ferromagnetic layers which are separated by a thin insulating barrier, and operates by tunneling of electrons between the two ferromagnetic layers through the insulating barrier. Scaling of MRAM cells in advanced technology nodes is limited by the resolution limit of both lithography and etching techniques. As the MRAM cells are scaled down, series resistance to the MRAM cells are increased in some cases, leading to higher power consumption. Although existing approaches in MRAM device formation have generally been adequate for their intended purposes, they have not been entirely satisfactory in all respects. Accordingly, there exists a need for improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F, 3G, 3H, 3I, 3J, 3K, 3K-1, 3L, 3M, 3M-1, 3N, 3O, 3P, and 3Q illustrate cross-sectional views of a semiconductor structure during a fabrication process according to the method of FIGS. 2A-2B, in accordance with some embodiments.

DETAILED DESCRIPTION

Figure 1A:
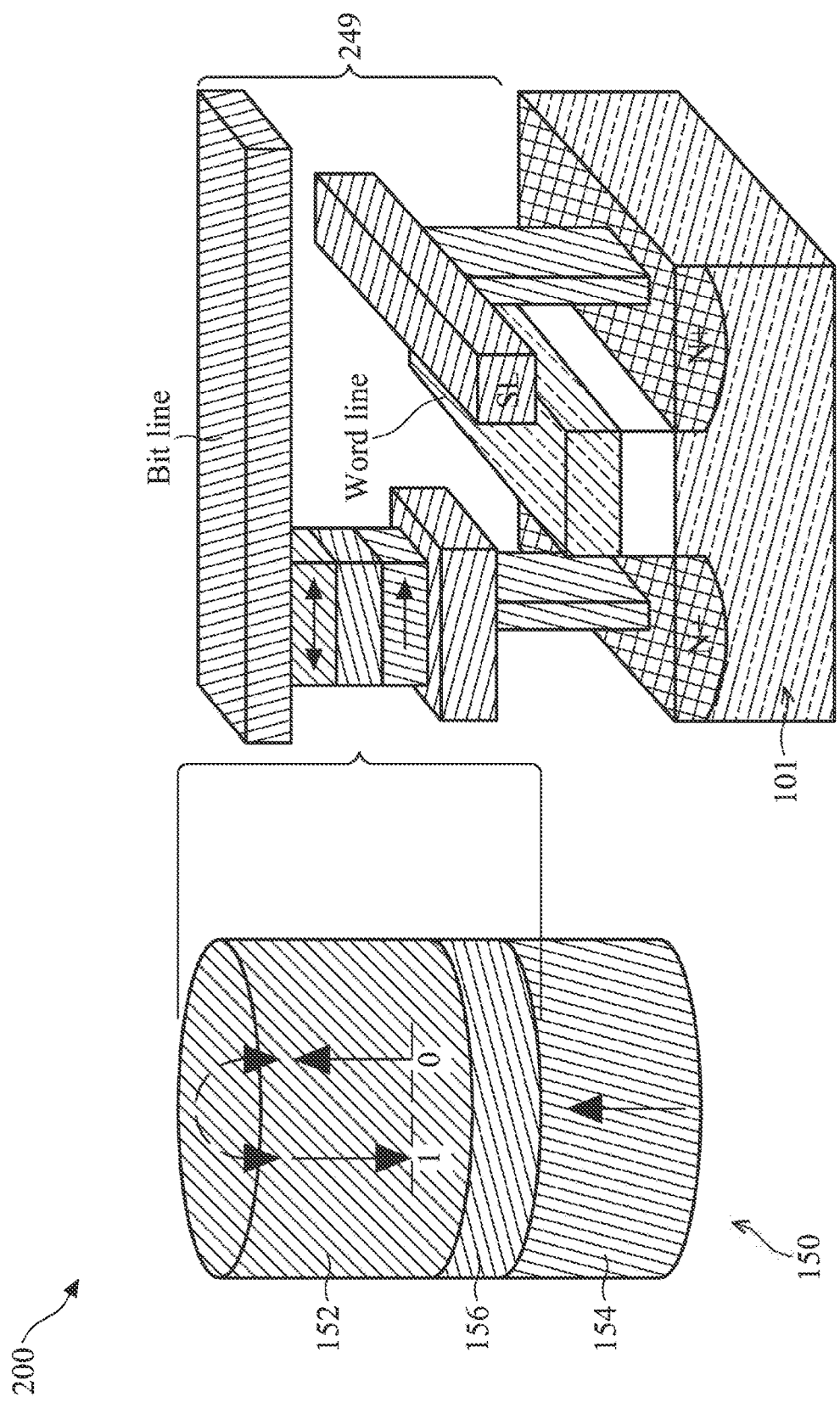
FIGS. 1A and 1B illustrate perspective views of a semiconductor device with an MRAM integrated therein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and fabrication methods. More particularly, the present disclosure is related to providing a semiconductor device with MRAM and logic device integrated therein. The MRAM is provided in an MRAM device region (or MRAM region) of the semiconductor device and the logic devices are provided in a logic device region (or logic region) of the semiconductor device. The MRAM includes an array of MRAM cells arranged into row and columns. The MRAM cells in the same row are connected to a common word line, and the MRAM cells in the same column are connected to a common bit line. Slot vias are provided as part of the bit lines for reduced series resistance on the bit lines. The slot vias are fabricated by the same process that forms vias in a logic region to simplify the manufacturing processes.

Figure 1B:
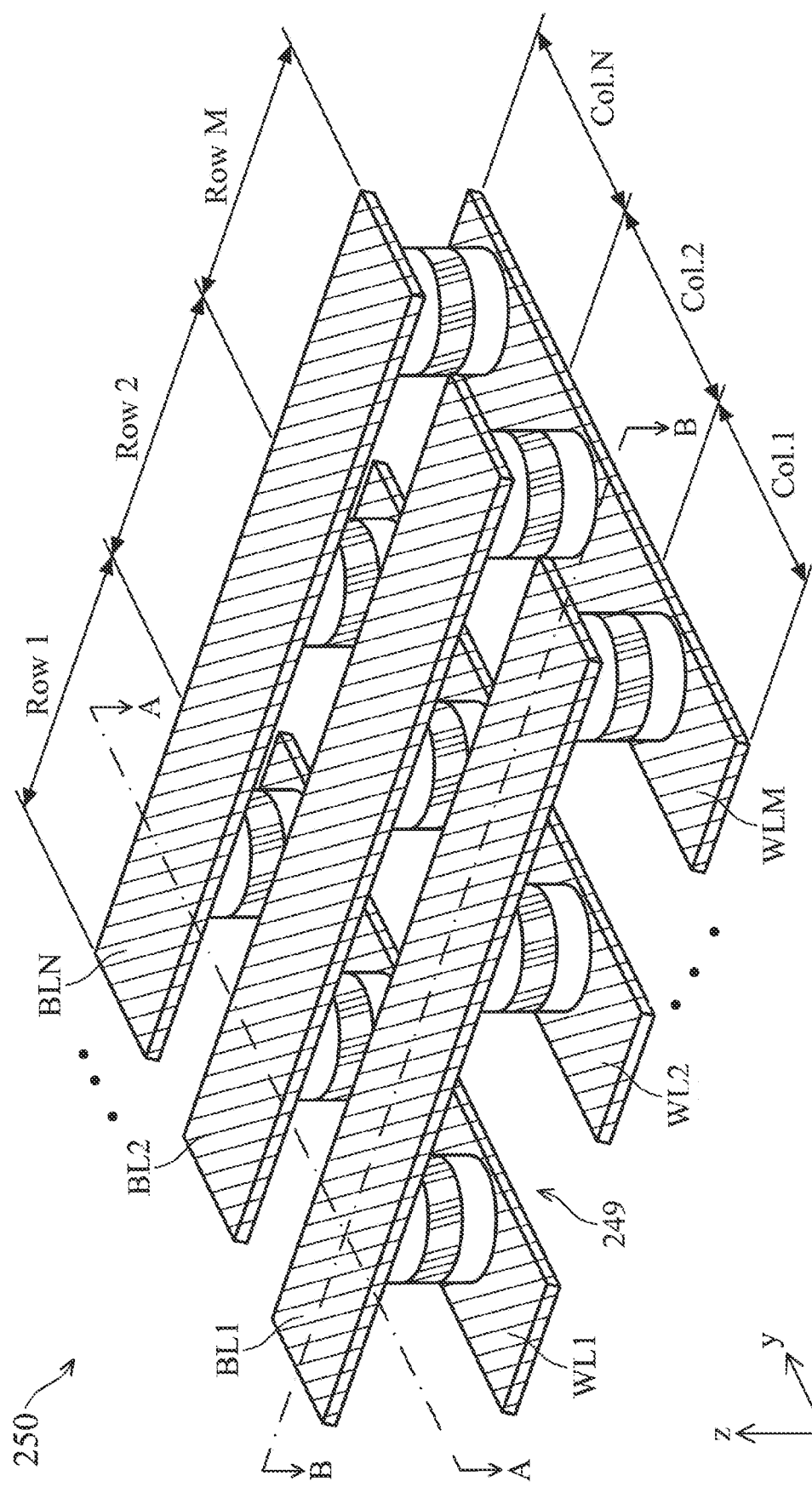

FIGS. 1A and 1B illustrate perspective views of a device (or semiconductor device or structure) 200 having an MRAM array 250. Particularly, FIG. 1A illustrates a building block of the MRAM array 250—a MRAM cell 249 having an MTJ 150 (or MTJ stack 150). The MTJ 150 includes an upper ferromagnetic plate 152 and a lower ferromagnetic plate 154, which are separated by a thin insulating layer 156, also referred to as a tunnel barrier layer. One of the two ferromagnetic plates (e.g., the lower ferromagnetic plate 154) is a magnetic layer that is pinned to an antiferromagnetic layer (also referred to as a fixed or pinned layer 154), while the other ferromagnetic plate (e.g., the upper ferromagnetic plate 152) is a "free" magnetic layer that can have its magnetic field changed to one of two or more values to store one of two or more corresponding data states (also referred to as a free layer 152).

The MTJ 150 uses tunnel magnetoresistance (TMR) to store magnetic fields on the upper and lower ferromagnetic plates 152 and 154. For a sufficiently thin insulating layer 156 (e.g., about 10 nm or less thick), electrons can tunnel from the upper ferromagnetic plate 152 to the lower ferromagnetic plate 154. Data may be written to the cell in many ways. In one method, current is passed between the upper and lower ferromagnetic plates 152 and 154, which induces a magnetic field stored in the free magnetic layer (e.g., the upper ferromagnetic plate 152). In another method, spin-transfer-torque (STT) is utilized, wherein a spin-aligned or polarized electron flow is used to change the magnetic field within the free magnetic layer with respect to the pinned magnetic layer. Other methods to write data may be used. However, all data write methods include changing the magnetic field within the free magnetic layer with respect to the pinned magnetic layer.

The electrical resistance of the MTJ 150 changes in accordance with the magnetic fields stored in the upper and lower ferromagnetic plates 152 and 154, due to the magnetic tunnel effect. For example, when the magnetic fields of the upper and lower ferromagnetic plates 152 and 154 are aligned (or in the same direction), the MTJ 150 is in a low-resistance state (i.e., a logical "0" state). When the magnetic fields of the upper and lower ferromagnetic plates 152 and 154 are in opposite directions, the MTJ 150 is in a high-resistance state (i.e., a logical "1" state). The direction of the magnetic field of the upper ferromagnetic plate 152 can be changed by passing a current through the MTJ 150. By measuring the electrical resistance between the upper and lower ferromagnetic plates 152 and 154, a read circuitry coupled to the MTJ 150 can discern between the "0" and "1" states. FIG. 1A further shows that the upper ferromagnetic plate 152 of an MTJ 150 is coupled to a bit line, the lower ferromagnetic plate 154 of an MTJ 150 is coupled to a source (or drain) of a transistor in a transistor structure 101, the drain (or source) of the transistor is coupled to a supply line (SL), and the gate of the transistor is coupled to a word line (WL). The MTJ 150 can be accessed (such as read or written) through the bit line, word line, and the supply line.

FIG. 1B illustrates an MRAM array 250, which includes M rows (words) and N columns (bits) of MRAM cells (or MRAM devices) 249. Each MRAM cell 249 comprises an MTJ 150. Word lines $WL_1$, $WL_2$, ... $WL_M$ extend across respective rows of MRAM cells 249 and bit lines $BL_1$, $BL_2$, ... $BL_N$ extend along columns of MRAM cells 249.

Figure 1C:
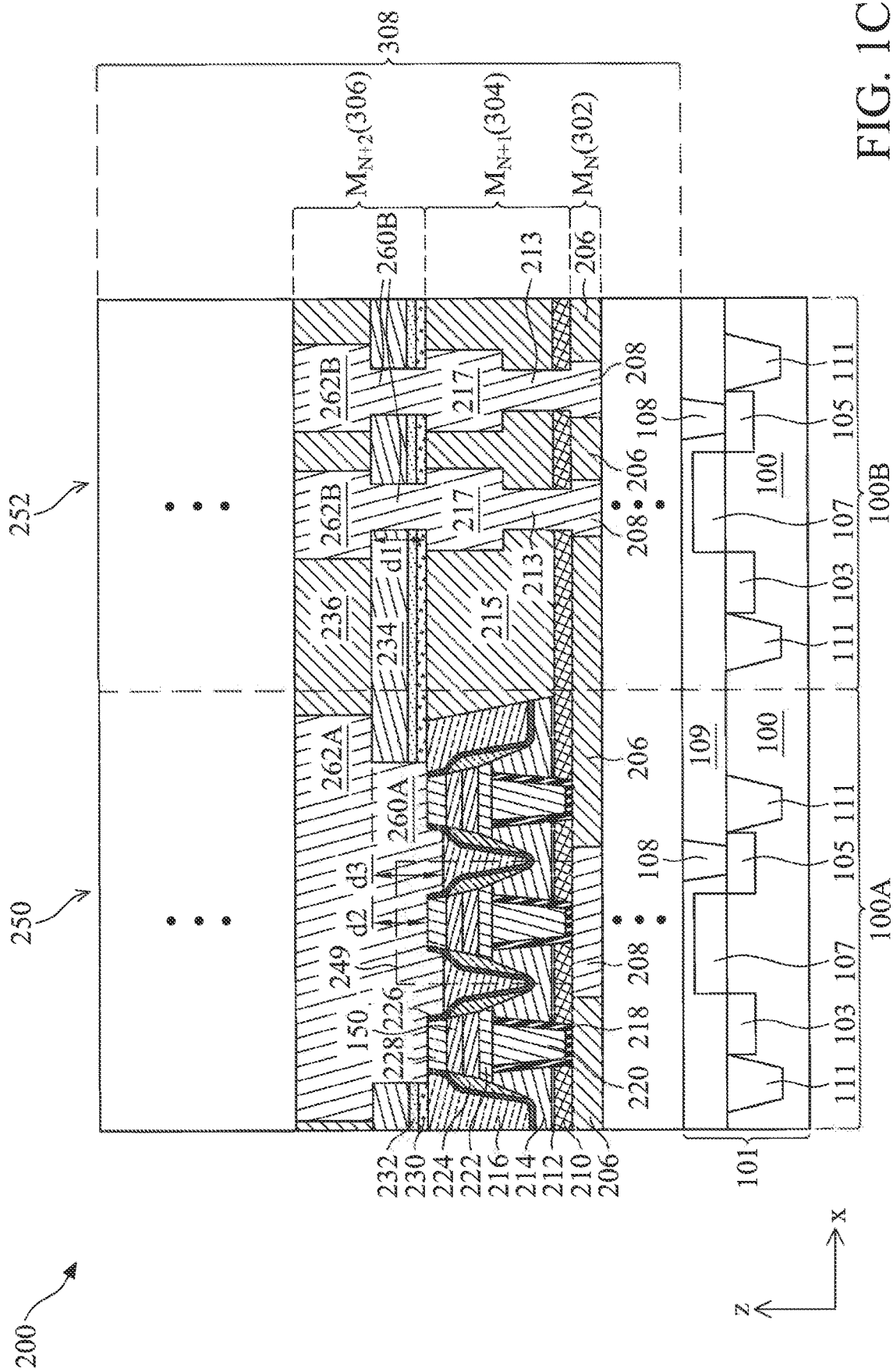
FIG. 1C illustrates a cross-sectional view of the semiconductor device in FIGS. 1A and 1B, in accordance with an embodiment.

FIG. 1C shows a cross-sectional view of the device 200 along the bit line direction of the MRAM array 250 (i.e., the B-B line in FIG. 1B), showing both the MRAM array 250 and logic devices 252 in the same figure, in accordance with some embodiments of the present disclosure. Referring to FIG. 1C, the MRAM array 250 is provided in a MRAM region 100A, while the logic devices 252 are provided in a logic region 100B. The logic devices 252 may be used for implementing write/read logic for accessing the MRAM array 250 or perform other functions. The MRAM region 100A and the logic region 100B have a common transistor structure 101 in or on a semiconductor substrate 100.

In some embodiments, the semiconductor substrate 100 may be but is not limited to, a silicon substrate (such as a silicon wafer). Alternatively, the semiconductor substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epitaxial layer, a gradient semiconductor layer, and/or a semiconductor layer overlying another semiconductor layer of a different type, such as a silicon layer on a silicon germanium layer. The semiconductor substrate 100 may or may not include doped regions, such as a p-well, an n-well, or combinations thereof.

The semiconductor substrate 100 further includes heavily doped regions such as sources 103 and drains 105 at least partially in the semiconductor substrate 100. A gate 107 is positioned over a top surface of the semiconductor substrate 100 and between the source 103 and the drain 105. Contact plugs 108 are formed in inter-layer dielectric (ILD) 109 and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 may be formed from a variety of dielectric materials such as an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The transistors in the transistor structure 101 can be planar transistors or non-planar transistor, such as FinFET.

In some embodiments, a shallow trench isolation (STI) 111 is provided to define and electrically isolate adjacent transistors. A number of STI 111 are formed in the semiconductor substrate 100. The STI 111 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI 111 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), and the like. Alternatively, the STI 111 may also be formed of any suitable "low dielectric constant" or "low-k" dielectric material, where k is less than or equal to about 4.

FIG. 1C further illustrates that the device 200 includes an interconnect structure 308 over the transistor structure 101.

The interconnect structure 308 includes three adjacent metal layers 302, 304, and 306 and other metal layers not shown. The metal layer 302 is the $N^{th}$ metal layer above the top surface the transistor structure 101, while the metal layers 304 and 306 are the $(N+1)^{th}$ metal layer and the $(N+2)^{th}$ metal layer, respectively. Thus, the metal layers 302, 304, and 306 are also referred to metal layers MN, $M_{N+1}$, and $M_{N+2}$ in some embodiments. The number N can be any natural number. For example, N may be 3, 4, 5, 6, or another natural number. In the present embodiment, the MRAM cells 249 are implemented in the metal layer 304.

The metal layer 302 includes an inter-metal dielectric (IMD) layer 206 and metal lines 208 in both the MRAM region 100A and the logic region 100B. The IMD layer 206 can be an oxide, such as silicon dioxide, a low-k dielectric material such as carbon doped oxides, or an extreme low-k dielectric material such as porous carbon doped silicon dioxide. The metal lines 208 can be made of a metal, such as aluminum, copper, or combinations thereof.

The metal layer 304 includes a dielectric layer 210 (also referred to as a dielectric barrier layer (SBL)) that extends through both the MRAM region 100A and the logic region 100B. For example, the dielectric layer 210 may include one or more dielectric materials such as $Si_3N_4$, SiON, SiC, SiCN, or a combination thereof in various embodiments. In the MRAM region 100A, the metal layer 304 further includes the MRAM cells 249 surrounded by one or more dielectric layers 210, 212, 214, 216, and 226. In the logic region 100B, the metal layer 304 further includes metal vias 213 and metal lines 217 surrounded by one or more dielectric layers 210 and 215. The various components in the metal layer 304 are further described below.

In an embodiment, the dielectric layer 212 includes a metal-based dielectric material, such as aluminum oxide (i.e., $AlO_x$ such as $Al_2O_3$). In an embodiment, the dielectric layer 214 includes a low-k dielectric material, such as a silicon oxide based low-k dielectric material. For example, the dielectric layer 214 may include un-doped silicate glass (USG), or doped silicon oxide such as borophosphosilicate glass (BPSG), fused silica glass (FSG), phosphosilicate glass (PSG), boron doped silicon glass (BSG), and/or other suitable dielectric materials. In an embodiment, the dielectric layer 216 includes one or more oxide based dielectric materials such as silicon dioxide, tetraethylorthosilicate (TEOS) formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In an embodiment, the dielectric layer 226 includes a dielectric material that is different from the materials in the dielectric layer 216 and the materials in a top electrode 228 (discussed below). For example, the dielectric layer 226 may include a metal-based dielectric material, such as aluminum oxide (i.e., $AlO_x$ such as $Al_2O_3$).

In the present embodiment, each MRAM cell 249 includes a bottom electrode via (BEVA) 220 and a conductive barrier layer 218 on sidewalls and a bottom surface of the BEVA 220. The conductive barrier layer 218 may be disposed directly on one of the metal lines 208 in the metal layer 302, which is connected to a via on one of the source and drain features of the transistors in the transistor structure 101 (such connection is not shown in FIG. 1C, but see FIG. 1A). The BEVA 220 may include tungsten, titanium, tantalum, tungsten nitride, titanium nitride, tantalum nitride, a combination thereof, or other suitable metal or metal compound. The barrier layer 218 may include titanium nitride, tantalum nitride, or other suitable conductive diffusion barrier. The barrier layer 218 is disposed between the BEVA 220 and the surrounding dielectric layers 210, 221, and 214.

In the present embodiment, each MRAM cell 249 further includes a bottom electrode (BE) 222 disposed on the BEVA 220, an MTJ (or MTJ stack) 150 disposed on the BE 222, and a top electrode (TE) 228 disposed on the MTJ 150. In an embodiment, each of the BE 222 and the TE 228 may include a metal nitride such as TaN, TiN, Ti/TiN, TaN/TiN, Ta or the combinations thereof. In some embodiments, the MTJ 150 may include ferromagnetic layers, MTJ spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The MTJ spacer may include non-ferromagnetic metal, for example, Ag, Au, Cu, Ta, W, Mn, Pt, Pd, V, Cr, Nb, Mo, Tc, Ru or the like. Another MTJ spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer 152 (FIG. 1A) whose magnetic polarity or magnetic orientation can be changed during write operation of its associated MRAM cell 249. The ferromagnetic layers and the MTJ spacer may function as a fixed or pinned layer 154 (FIG. 1A) whose magnetic orientation may not be changed during operation of its associated MRAM cell 249. It is contemplated that the MTJ 150 may include an antiferromagnetic layer in accordance with other embodiments.

In the present embodiment, each MRAM cell 249 further includes dielectric spacers 224 on sidewalls of the MTJ 150 and the BE 222. The spacers 224 may include one or more dielectric materials such as silicon oxide ($SiO_x$), silicon nitride ($SiN_x$), silicon oxynitride ($Si_xO_yN_z$), or the like. The dielectric layer 226 is disposed over the spacers 224 and over the sidewalls of the TE 228 in the present embodiment.

In the present embodiment, the metal layer 304 in the logic region 100B includes the metal vias 213, the metal lines 217, and the dielectric layers 210 and 215. The metal vias 213 are electrically connected to some of the metal lines 208 in the metal layer 302. The dielectric layer 215 can be an oxide, such as silicon dioxide, a low-k dielectric material such as carbon doped oxides, or an extreme low-k dielectric material such as porous carbon doped silicon dioxide. The metal vias 213 and the metal lines 217 can be made of a metal, such as aluminum, copper, or combinations thereof.

The metal layer 306 includes metallic features 260A, 260B, 262A, and 262B surrounded by one or more dielectric layers 230, 232, 234, and 236. The dielectric layers 230, 232, 234, and 236 extend across both the MRAM region 100A and the logic region 100B. The metallic features 260A and 262A are disposed in the MRAM region 100A. The metallic features 260B and 262B are disposed in the logic region 100B. The various components in the metal layer 306 are further described below.

In an embodiment, the dielectric layer 230 includes a material that is the same as or similar to the material(s) in the dielectric layer 210. For example, the dielectric layer 230 may include one or more dielectric materials such as $Si_3N_4$, SiON, SiC, SiCN, or a combination thereof. In an embodiment, the dielectric layer 232 includes a material that is the same as or similar to the material(s) in the dielectric layer 212. For example, the dielectric layer 232 may include a metal-based dielectric material, such as aluminum oxide (i.e., $AlO_x$ such as $Al_2O_3$) or other metal oxides. In an embodiment, the dielectric layer 234 includes a low-k dielectric material, such as a silicon oxide based low-k dielectric material. For example, the dielectric layer 234 may include un-doped silicate glass (USG), or doped silicon oxide such as borophosphosilicate glass (BPSG), fused silica glass (FSG), phosphosilicate glass (PSG), boron doped silicon glass (BSG), and/or other suitable dielectric materials. In an embodiment, the dielectric layer 236 includes one or more oxide based dielectric materials such as silicon dioxide, tetraethylorthosilicate (TEOS) formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

In the present embodiment, the metallic features 260B and 262B are metal vias and metal lines respectively. The metal vias 260B and the metal lines 262B can be made of a metal, such as aluminum, copper, or combinations thereof. In the present embodiment, the metallic feature 260A is a slot via which is formed in the same process that forms the vias 260B and includes the same material as the vias 260B, and the metallic feature 262A is a metal line which is formed in the same process that forms the metal lines 262B and includes the same material as the metal lines 262B. The slot via 260A and the metal line 262A are part of a bit line for the MRAM array 250. The slot via 260A is disposed over a column of MRAM cells 249 that share the same bit line (see FIG. 1B). In some embodiments, the slot via 260A is disposed over a plurality of contiguous MRAM cells 249 (which may be a subset of a column of MRAM cells 249) that share the same bit line. The below discussion applies to both scenarios (a column or a subset of a column) when referring to a column of MRAM cells 249. In the present embodiment, the slot via 260A is disposed directly on and electrically connected to the TE 228 of each MRAM cells 249 in a column. In some embodiments, the slot via 260A is disposed directly on and electrically connected to the MTJ 150 of each MRAM cells 249 in a column. The slot via 260A extends continuously and laterally (along the "x" direction or bit line direction) from the first one of the MRAM cell 249 to the last one of the MRAM cell 249 in a column. Compared with approaches where an individual via is disposed over each MRAM cell 249, having the slot via 260A contacting a column of MRAM cells 249 advantageously reduces the series resistance of the bit line.

Further, as shown in FIG. 1C, portions of the slot via 260A that are disposed between adjacent MTJs 150 extend below the top surface of the TE 228, and in some embodiment, even below the top surface of the MTJ 150 (as will be discussed later). This advantageously increases the volume of the slot via and further reduces the series resistance of the bit line. In the present embodiment, the vias 260B have a thickness d1, portions of the slot via 260A that are directly above the MTJ 150 have a thickness d2, and portions of the slot via 260A that are laterally between two adjacent MTJs 150 have a thickness d3. In an embodiment, the thickness d2 is equal to or greater than the thickness d1, and the thickness d3 is greater than the thickness d1. In some embodiments, the thickness d3 is equal to or greater than the thickness d2. For example, the thickness d3 is greater than the thickness d2 by about 5 nm to about 50 nm in some embodiments. In some examples, the thickness d2 is in a range of 40 nm to 80 nm, and the thickness d3 is in a range of 45 nm to 130 nm. The above thicknesses d1, d2, and d3 are measured from the bottom surface of the respective vias 260A and 260B to the top surface of the dielectric layer 234. Further, in some embodiments, the length of the slot via (i.e., along the "x" direction) is in a range of about 100 nm to about 10,000 nm, while the width of the slot via (i.e., along the "y" direction into and out of the page of FIG. 1C) is in a range of about 20 nm to about 100 nm. In embodiments, the metal lines 262A and 262B have about the same thickness.

Figure 2A:
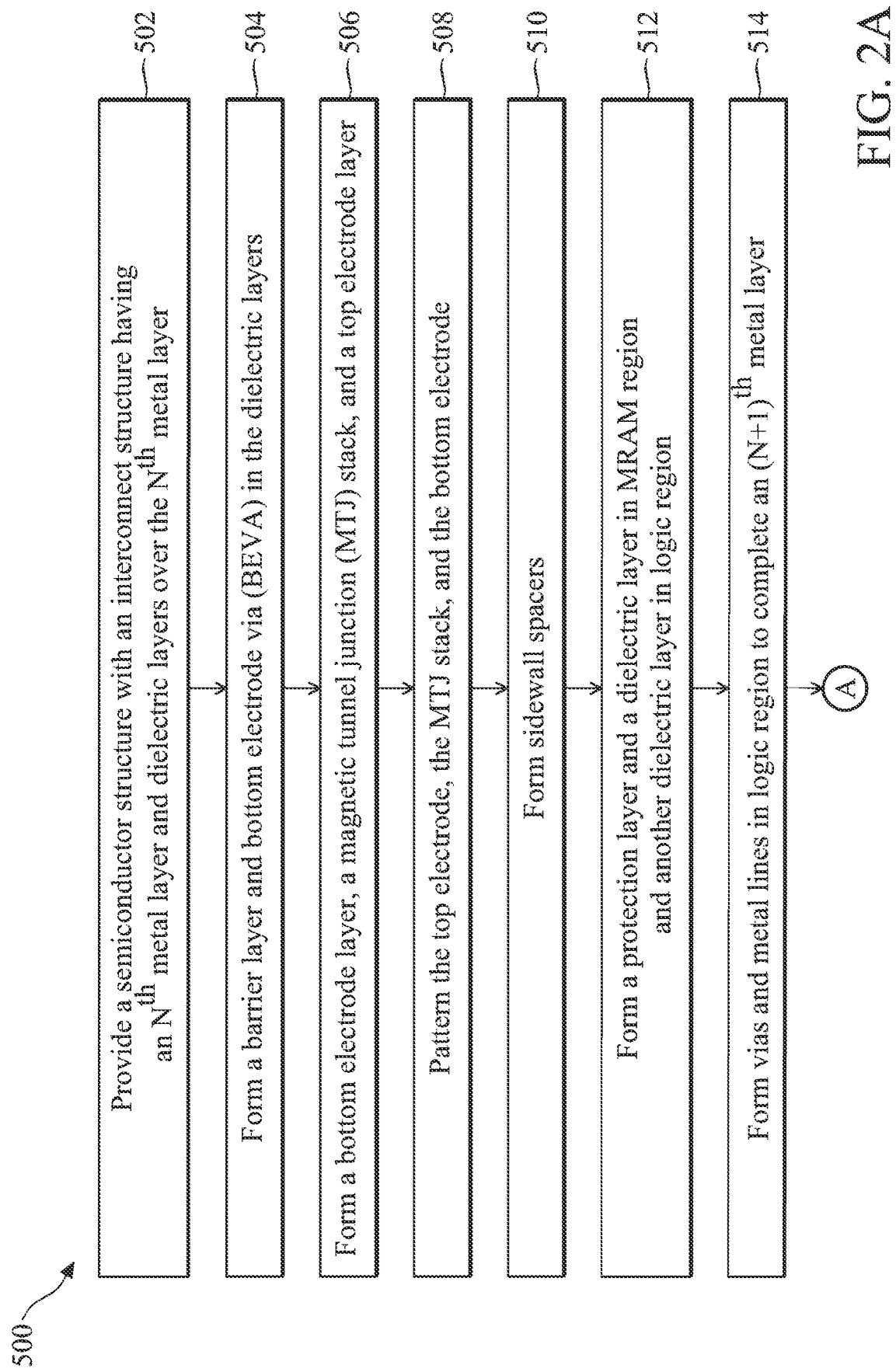
FIGS. 2A and 2B show a flow chart of a method for forming a semiconductor device with an MRAM array integrated therein, according to an embodiment of the present disclosure.
Figure 2B:
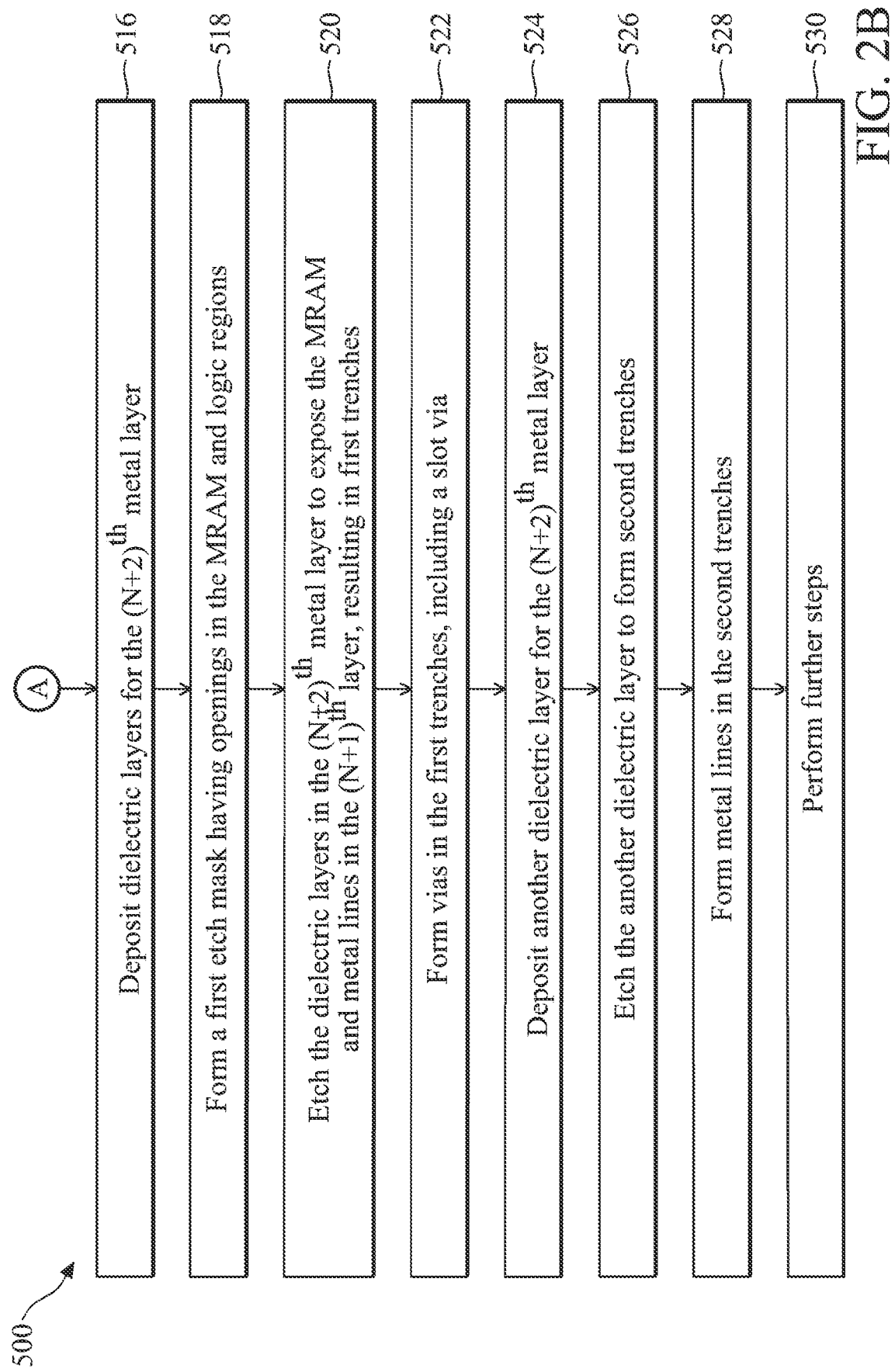
Figure 2C:
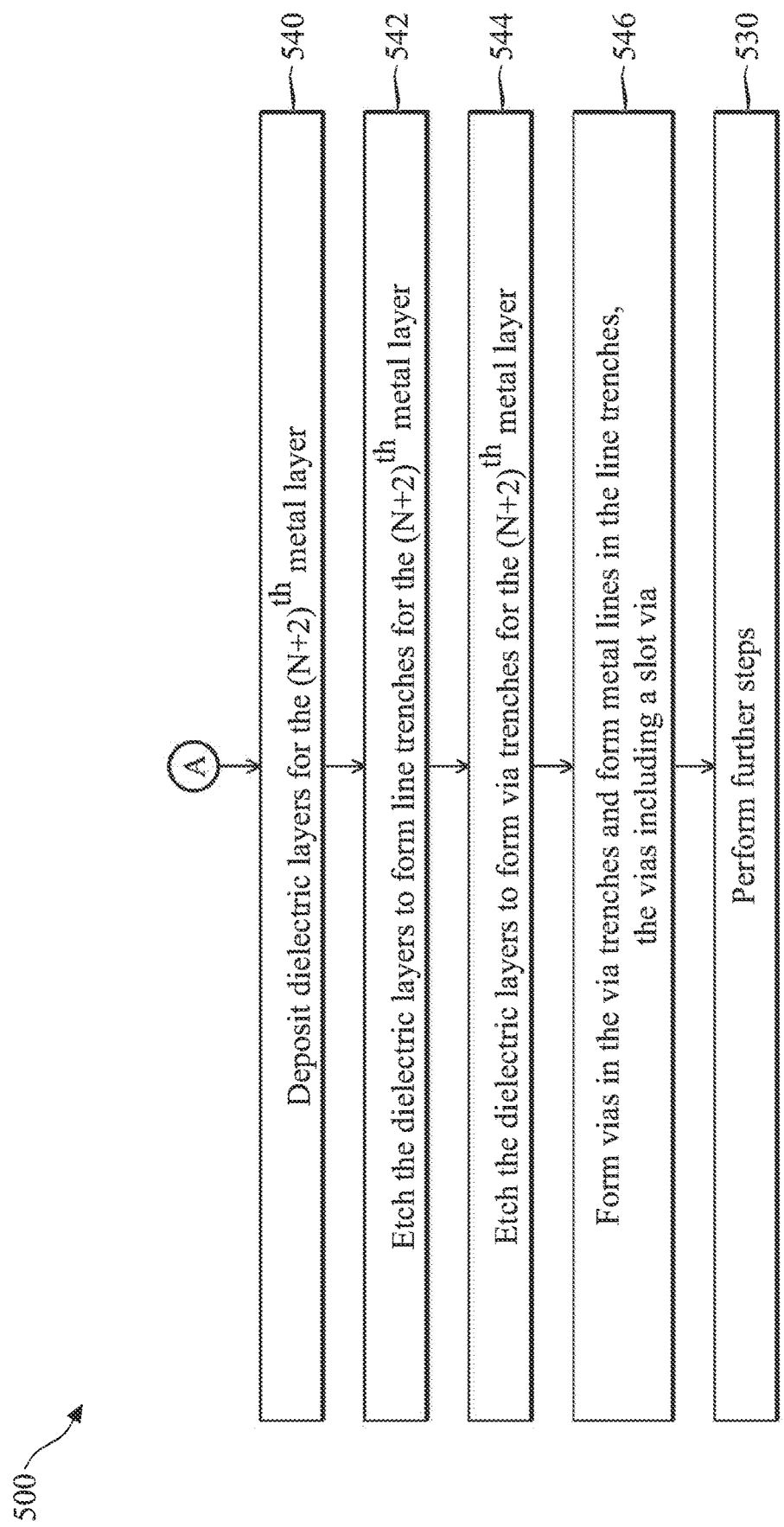
FIG. 2C shows a flow chart of a method for forming a semiconductor device with an MRAM integrated therein, according to alternative embodiments of the present disclosure.

FIGS. 2A and 2B illustrate a flow chart of a method 500 for forming the semiconductor device 200 having an MRAM array and logic devices integrated in accordance with an embodiment. FIG. 2C illustrates a flow chart of certain operation of the method 500 in an alternative embodiment. The method 500 is merely an example, not intended to limit the present disclosure beyond what is explicitly recited in the claims. Additional operations can be provided before, during, and after the method 500, and some operations described can be replaced, eliminated, or relocated for additional embodiments of the method. The method 500 is described below in conjunction with FIGS. 3A-8, which illustrate various cross-sectional views of the semiconductor device 200 during fabrication steps according to the method 500.

At operation 502, the method 500 (FIG. 2A) provides, or is provided with, a device 200 having a metal layer 302 and various dielectric layers 210, 212, and 214 disposed over the metal layer 302, such as shown in FIG. 3A. Although not shown in FIG. 3A, the device 200 further includes a transistor structure (such as the transistor structure 101 in FIG. 1C) disposed in or on a substrate (such as the semiconductor substrate 100 in FIG. 1C). The metal layer 302 is an $N^{th}$ metal layer above the transistor structure, where N is a natural number. The device 200 includes an MRAM region 100A for forming an MRAM array therein and a logic region 100B for forming logic devices therein. The metal layer 302 includes an IMD layer 206 and metal lines 208 in both the MRAM region 100A and the logic region 100B. The IMD layer 206 can be an oxide, such as silicon dioxide, a low-k dielectric material such as carbon doped oxides, or an extreme low-k dielectric material such as porous carbon doped silicon dioxide. The metal lines 208 can be made of a metal, such as aluminum, copper, or combinations thereof. The IMD layer 206 may be formed by deposition process, such as physical vapor deposition (PVD) or chemical vapor deposition (CVD) including plasma enhanced chemical vapor deposition (PECVD). The metal lines 208 be formed by a deposition process such as PVD, CVD, ALD, or a plating process. In an embodiment, the dielectric layer 210 may include one or more dielectric materials such as $Si_3N_4$, SiON, SiC, SiCN, or a combination thereof, and may be deposited using PVD, CVD, ALD, or other suitable processes to a thickness in a range of about 12 nm to about 20 nm. In an embodiment, the dielectric layer 212 includes a metal-based dielectric material, such as aluminum oxide, and may be deposited using CVD, ALD, or other suitable processes to a thickness in a range of about 2 nm to about 6 nm. In an embodiment, the dielectric layer 214 includes a silicon oxide based dielectric material such as un-doped silicate glass (USG), and may be deposited using CVD, PVD, or other suitable processes to a thickness in a range of about 40 nm to about 100 nm.

At operation 504, the method 500 (FIG. 2A) forms BEVA 220 and barrier layer 218 that penetrate through the dielectric layers 214, 212, and 210 and electrically connect to some of the metal lines 208 in the MRAM region 100A, such as shown in FIG. 3B. For example, the operation 504 may form an etch mask over the dielectric layer 214 using photolithography and etching processes, where the etch mask provides openings corresponding to the location of the BEVA 220 and the barrier layer 218 and covers the rest of the device 200. In an embodiment, each BEVA 220 corresponds to an MRAM cell 249 in an MRAM array 250. Then, the operation 504 etches the dielectric layers 214, 212, and 210 through the etch mask to reach the metal layer 302, thereby forming openings (or trenches or holes) in the dielectric layers 214, 212, and 210. Subsequently, the operation 504 deposits the barrier layer 218 on the surfaces of the openings and deposits the BEVA 220 over the barrier layer 218. Thereafter, the operation 504 may perform a chemical mechanical planarization (CMP) process to the BEVA 220 and the barrier layer 218, thereby removing any excessive materials on the top surface of the dielectric layer 214. In an embodiment, the barrier layer 218 may include titanium nitride, tantalum nitride, or other suitable conductive diffusion barrier, and may be deposited using ALD, PVD, CVD, or other suitable deposition methods; and the BEVA 220 may include tungsten, titanium, tantalum, tungsten nitride, titanium nitride, tantalum nitride, a combination thereof, or other suitable metal or metal compound, and may be deposited using CVD, PVD, ALD, plating, or other suitable deposition methods.

Figure 3C:
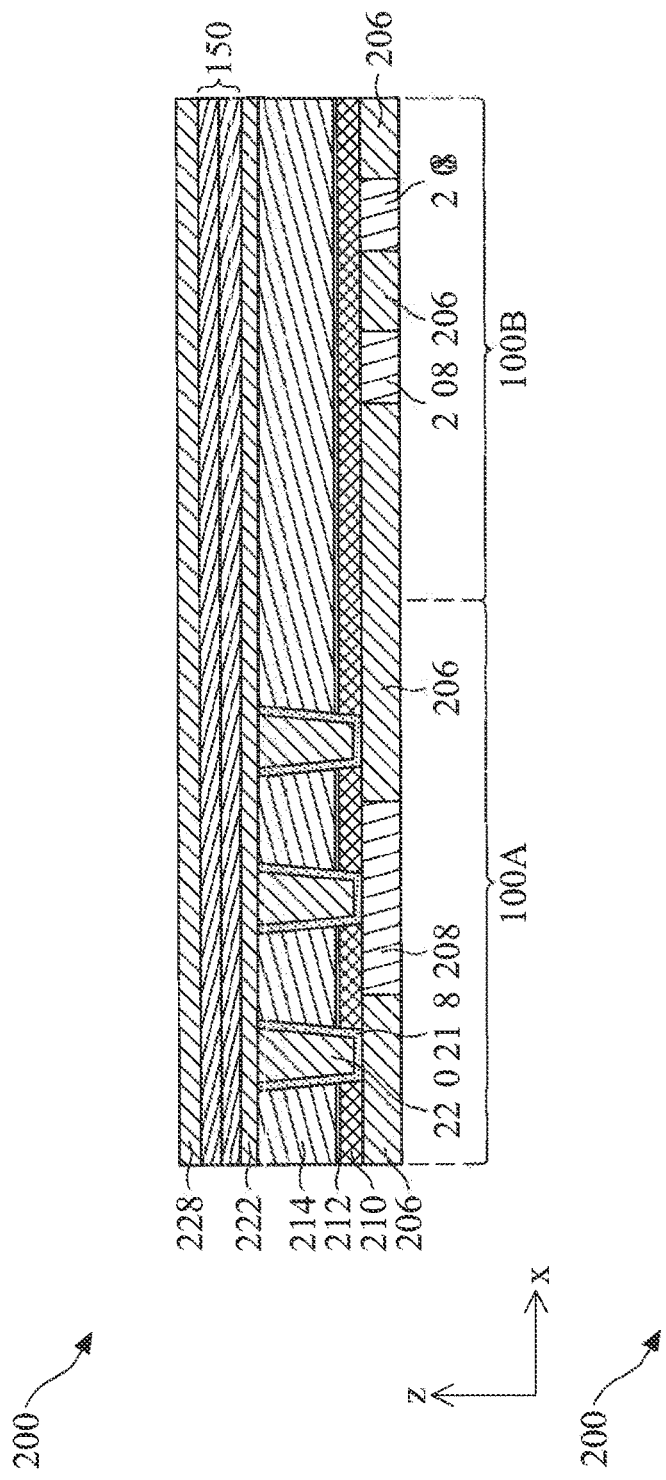

At operation 506, the method 500 (FIG. 2A) deposits a bottom electrode (BE) layer 222, an MTJ (or MTJ stack) 150, and a top electrode (TE) layer 228 over the dielectric layer 214, the barrier layer 218, and the BEVA 220, such as shown in FIG. 3C. Particularly, the BE layer 222 electrically connects to the BEVA 220. In an embodiment, the BE 222 may include a metal nitride such as TaN, TiN, Ti/TiN, TaN/TiN, Ta, or a combination thereof, and may be deposited using CVD, ALD, or other suitable deposition methods. The BE 222 may be formed to have a thickness in a range about 1 nm to about 8 nm in some embodiments. The MTJ 150 may be deposited using CVD, PVD, ALD, or other suitable deposition methods, and may have a thickness in a range of about 20 nm to about 50 nm in some embodiments. In an embodiment, the TE 228 may include a metal nitride such as TaN, TiN, Ti/TiN, TaN/TiN, Ta, or a combination thereof, and may be deposited using CVD, ALD, or other suitable deposition methods. The TE 228 may be formed to have a thickness in a range about 10 nm to about 25 nm in some embodiments.

Figure 3D:
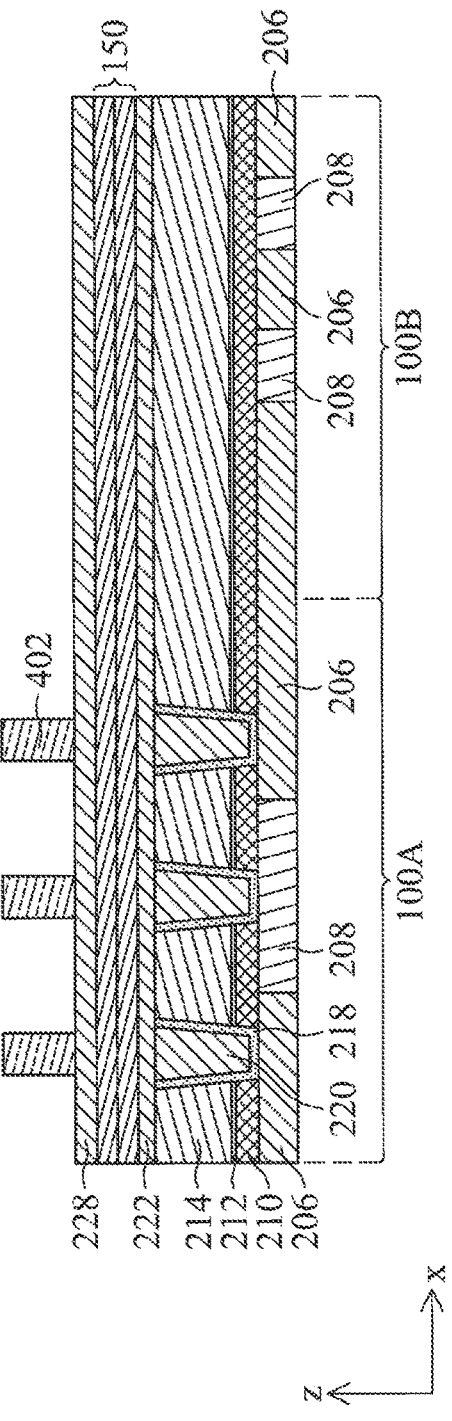
Figure 3E:
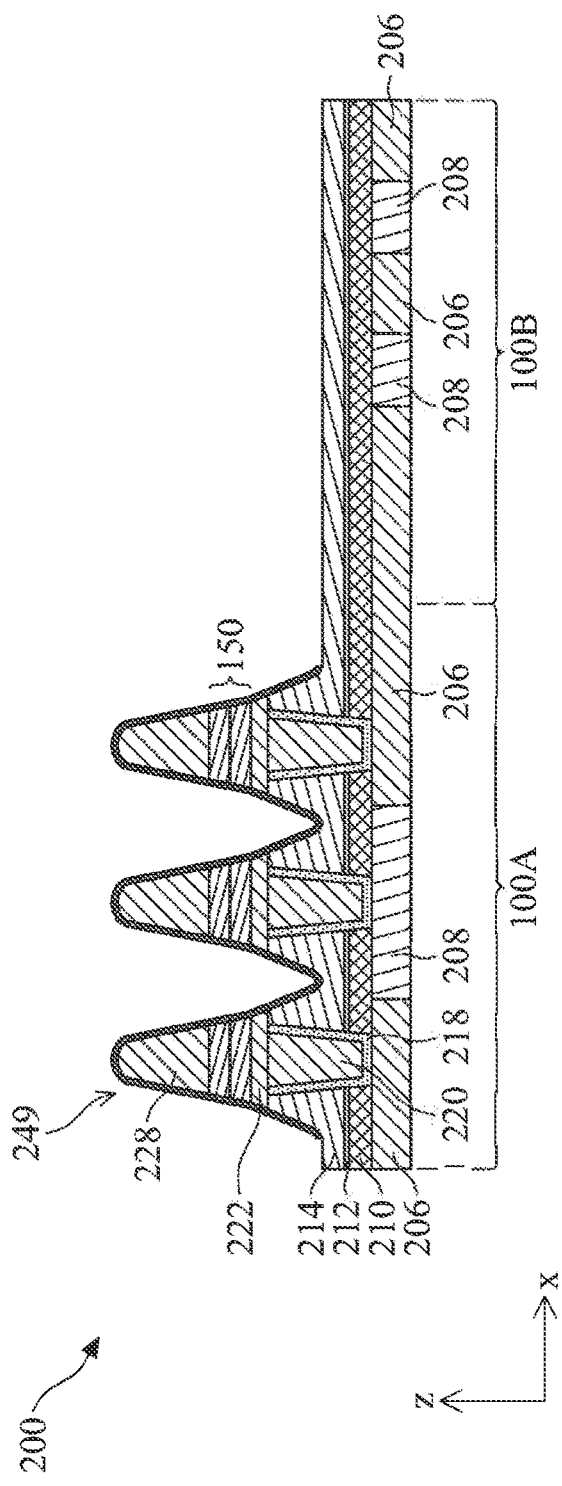

At operation 508, the method 500 (FIG. 2A) patterns the BE layer 222, the MTJ 150, and the TE layer 228 into individual MRAM cells 249. For example, using photolithography and etching processes, the operation 508 may form an etch mask 402 that covers the areas of the TE layer 228 that correspond to individual MRAM cells 249 and exposes the rest of the TE layer 228, such as shown in FIG. 3D. Then, the operation 508 etches the TE layer 228, the MTJ 150, the BE layer 222, and the dielectric layer 214 through the etch mask 402 to form individual MRAM cells 249, such as shown in FIG. 3E. The etching process may be wet etching, dry etching, reactive ion etching, or other suitable etching methods. The etch mask 402 is removed thereafter, using etching, stripping, ashing, or other suitable methods.

Figure 3F:
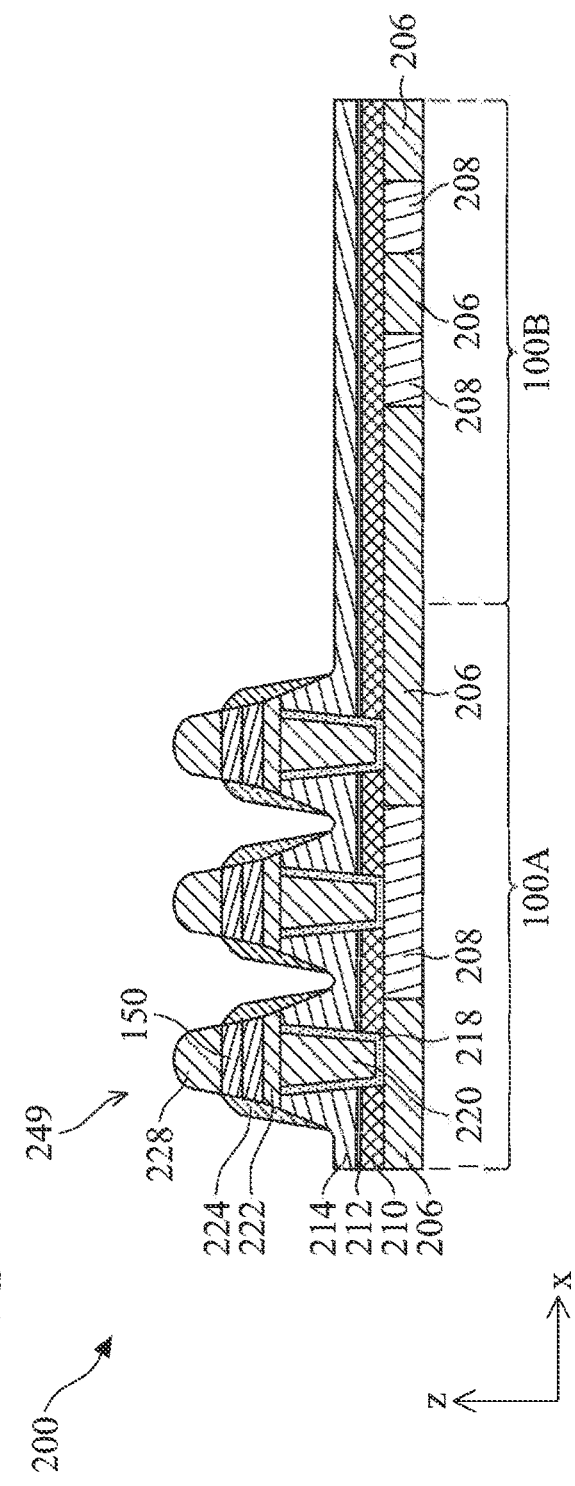

At operation 510, the method 500 (FIG. 2A) forms spacers 224 over the sidewalls of the MRAM cells 249, such as shown in FIG. 3F. In some embodiments, the spacers 224 are considered part of the MRAM cells 249. For example, the operation 510 may deposit a blanket dielectric layer over the device 200 in both the MRAM region 100A and the logic region 100B using CVD, ALD, or other suitable methods, then anisotropically etch the blanket dielectric layer to remove it from the top surface of the dielectric layer 214 and from the top surface of the TE 228. Portions of the dielectric layer remain on sidewalls of the MRAM cells 249, becoming the spacers 224. The spacers 224 may include one or more dielectric materials such as silicon oxide ($SiO_x$), silicon nitride ($SiN_x$), silicon oxynitride ($Si_xO_yN_z$), or the like. The spacers 224 may include one or multiple layers of the dielectric materials in various embodiments.

Figure 3G:
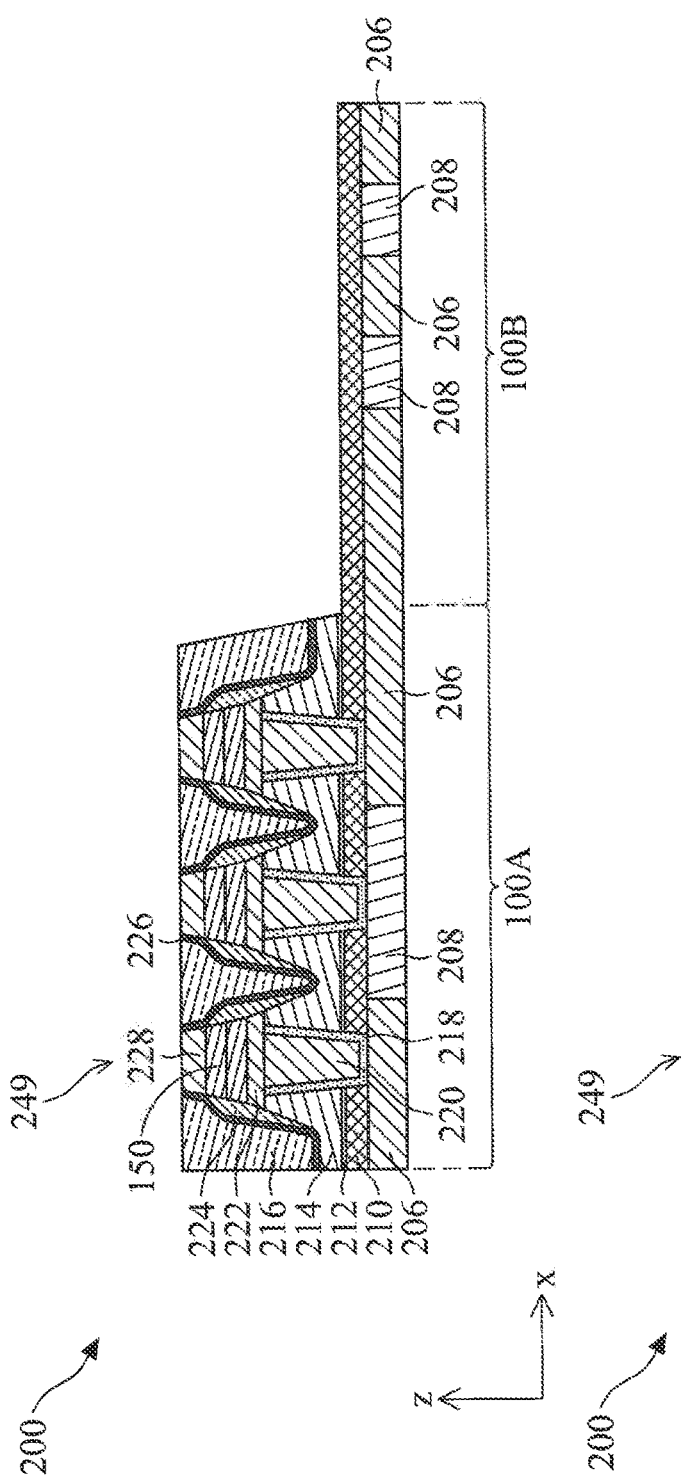

At operation 512, the method 500 (FIG. 2A) forms a dielectric layer (also referred to as a protection layer) 226 over the spacers 224 and the dielectric layer 214, and forms a dielectric layer 216 over the dielectric layer 226 in the MRAM region 100A, such as shown in FIG. 3G. For example, the operation 512 may deposit the dielectric layer 226 and the dielectric layer 216 in both the MRAM region 100A and the logic region 100B; form an etch mask using photolithography and etching processes where the etch mask covers the MRAM region 100A and exposes the logic region 100B; etch the dielectric layer 226 and the dielectric layers 216, 214, and 212 through the etch mask until the dielectric layer 210 is exposed in the logic region 100B; and remove the etch mask. The dielectric layer 226 may be deposited using CVD, ALD, or other suitable methods. The dielectric layer 216 may be deposited using CVD, PVD, or other suitable methods. The dielectric layer 226 and the dielectric layers 216, 214, and 212 may be etched using wet etching, dry etching, reactive ion etching, or other suitable methods.

Figure 3H:
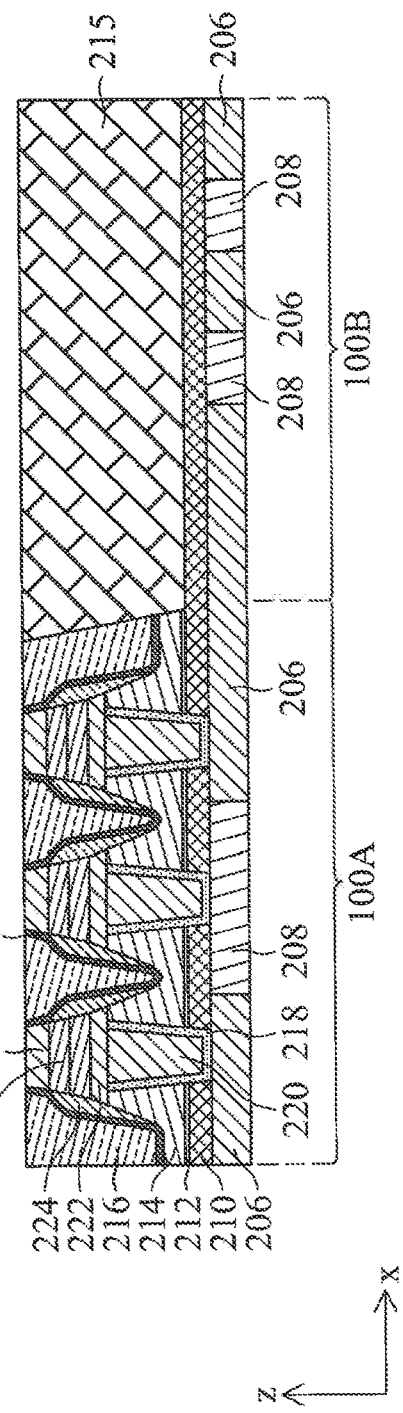
Figure 31:
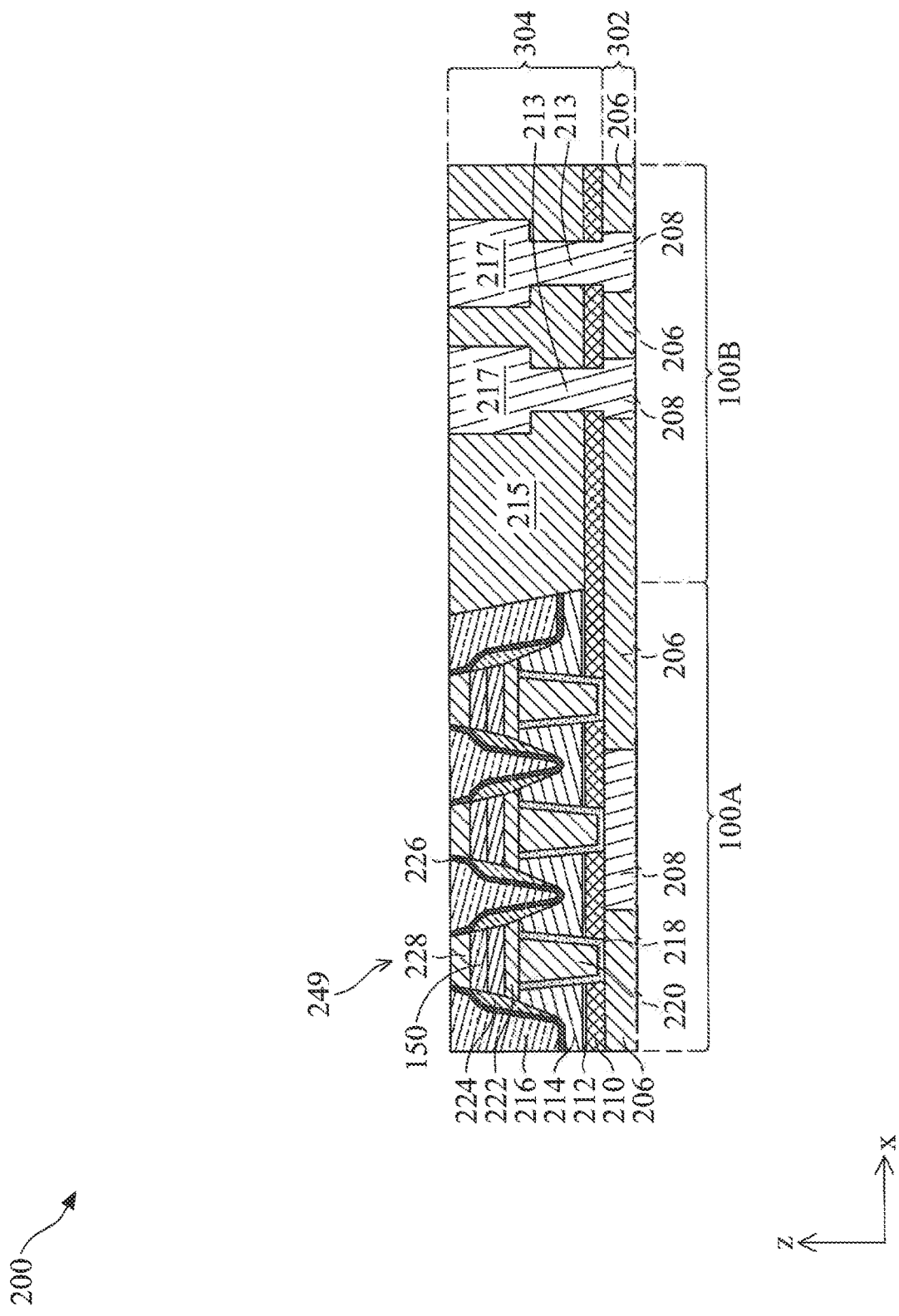

After the dielectric layer 226 and the dielectric layers 216, 214, and 212 are etched, the operation 512 further forms a dielectric layer 215 in the logic region 100B, such as shown in FIG. 3H. The dielectric layer 215 can be an oxide, such as silicon dioxide, a low-k dielectric material such as carbon doped oxides, or an extreme low-k dielectric material such as porous carbon doped silicon dioxide. The dielectric layer 215 may be deposited using CVD, PVD, or other suitable methods. The operation 512 further performs a CMP process to planarize the top surfaces of the dielectric layers 215 and 216, the dielectric layer 226, and the TE 228.

At operation 514, the method 500 (FIG. 2A) forms metal vias 213 and metal lines 217 in the logic region 100B, such as shown in FIG. 3I. The metal vias 213 and metal lines 217 may be formed using dual damascene process, or other suitable methods. For example, the operation 514 may etch holes and/or trenches in the dielectric layer 215 to expose the top surface of the metal lines 208, deposit one or more metals into the holes and/or trenches, and perform a CMP process to the one or more metals. Portions of the one or more metals remaining in the holes and/or trenches become the metal vias 213 and metal lines 217. The metal vias 213 and the metal lines 217 may include aluminum, copper, or other suitable low resistance metals, and may be deposited using PVD, CVD, ALD, plating, or other suitable methods. After the operation 514 finishes, the top surface of the metal lines 217 are substantially coplanar with the top surface of the TE 228. Using the operations 504 through 514, the metal layer 304 is thus formed over the metal layer 302.

Figure 3J:
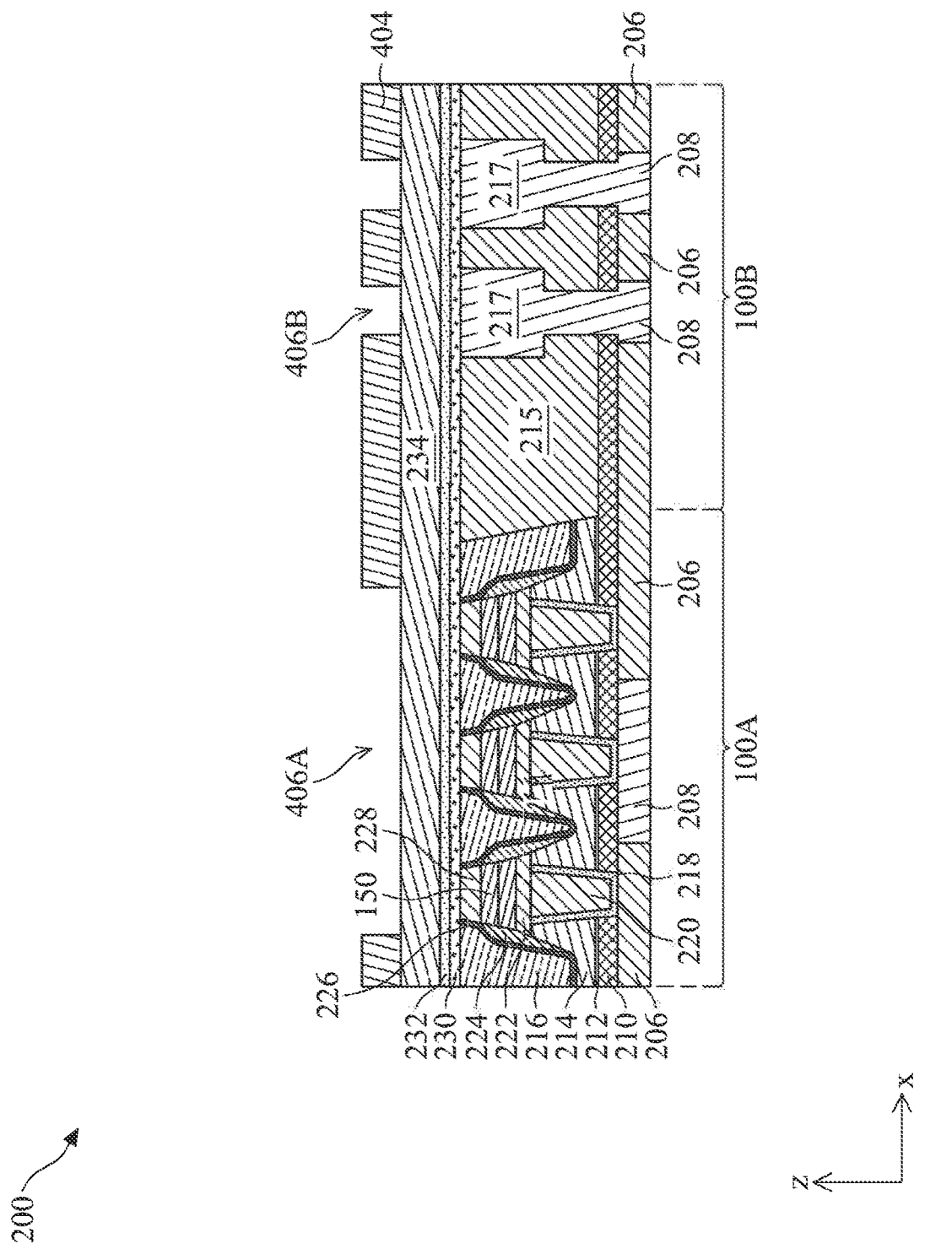

At operation 516, the method 500 (FIG. 2B) deposits dielectric layers 230, 232, and 234 over the metal layer 304 in both the MRAM region 100A and the logic region 100B, such as shown in FIG. 3J. In an embodiment, the dielectric layer 230 may include one or more dielectric materials such as a nitride (for example, silicon nitride) or silicon carbide, and may be deposited using ALD, CVD, PVD, or other suitable methods. The dielectric layer 230 may have a thickness in a range about 10 nm to about 15 nm in some embodiments. In an embodiment, the dielectric layer 232 may include a metal-based dielectric material, such as aluminum oxide (i.e., $AlO_x$ such as $Al_2O_3$), and may be deposited using ALD, CVD, PVD, or other suitable methods. The dielectric layer 232 may have a thickness in a range about 4 nm to about 10 nm in some embodiments. In an embodiment, the dielectric layer 234 may include un-doped silicate glass (USG), or doped silicon oxide such as borophosphosilicate glass (BPSG), fused silica glass (FSG), phosphosilicate glass (PSG), boron doped silicon glass (BSG), and/or other suitable dielectric materials, and may be deposited using CVD, PVD, or other suitable methods. The dielectric layer 234 may have a thickness in a range about 40 nm to about 100 nm in some embodiments.

At operation 518, the method 500 (FIG. 2B) forms an etch mask 404 over the dielectric layer 234, such as shown in FIG. 3J. The etch mask 404 provides openings 406A over the MRAM region 100A and openings 406B over the logic region 100B. In an embodiment, the etch mask 404 includes a material that has etch selectivity with respect to the dielectric layers 234, 232, and 230 in an etching process. For example, the etch mask 404 may include a resist pattern and may further include a patterned hard mask under the resist pattern in an embodiment. For example, the patterned hard mask may include titanium nitride and may have a thickness in a range of about 10 nm to about 40 nm in an embodiment. The operation 518 may include depositing a hard mask layer over the dielectric layer 234, coating a photoresist over the hard mask layer, performing photolithography (such as exposing and developing) to the photoresist layer to form a resist pattern, and etching the hard mask layer through the resist pattern to form a patterned hard mask. The patterned hard mask and the resist pattern collectively form the etch mask 404. In the present embodiment, each of the openings 406A corresponds to a column of MRAM cells 249 in the MRAM array 250. In some embodiments, each of the openings 406A corresponds to a subset of a column of MRAM cells 249 in the MRAM array 250. Thus, each of the openings 406A is generally longer (along the "x" direction) than the opening 406B that corresponds to a single via.

Figure 3K:
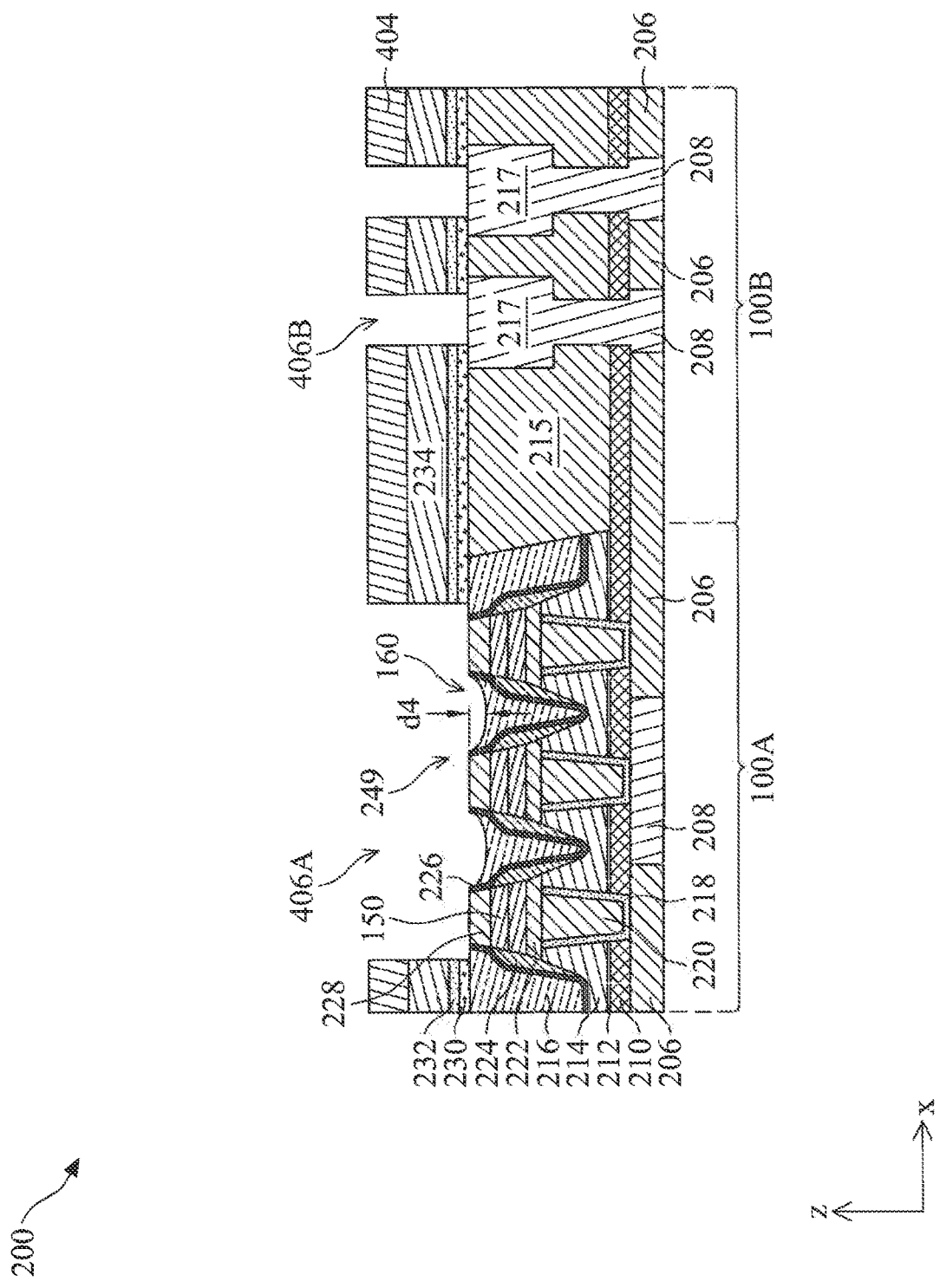
Figures 1, 3K:
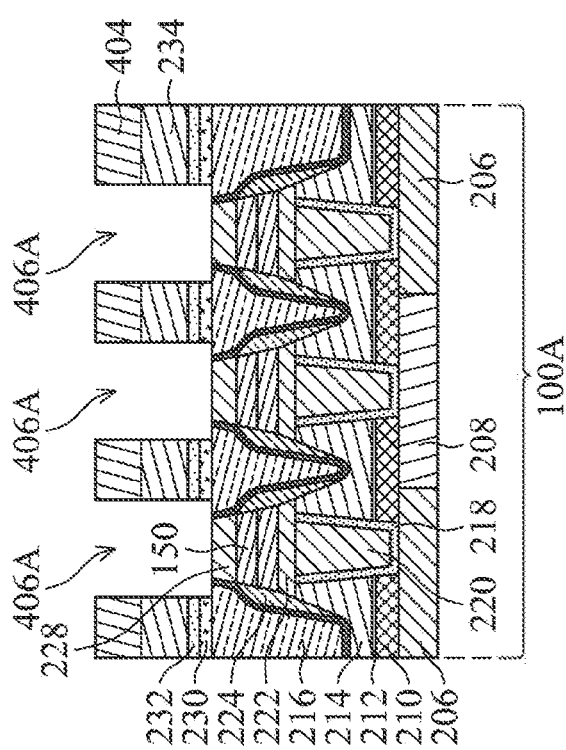

At operation 520, the method 500 (FIG. 2B) etches the dielectric layers 234, 232, and 230 through the etch mask 404 to expose the MRAM cells 249 in the MRAM region 100A and the metal lines 217 in the logic region 100B. FIGS. 3K and 3K-1 illustrate a resultant device 200 according to an embodiment. FIG. 3K illustrates the device 200 along the B-B line in FIG. 1B (i.e., along the "x" direction), and FIG. 3K-1 illustrates the device 200 along the A-A line in FIG. 1B (i.e., along the "y" direction perpendicular to the "x" direction). In an embodiment, the operation 520 may perform multiple etching processes that are designed to etch each of the dielectric layers 234, 232, and 230 separately. For example, the operation 520 may perform a first etching process that is designed to etch the dielectric layer 234 with minimal or no etching to the etch mask 404, perform a second etching process that is designed to etch the dielectric layer 232 with minimal or no etching to the etch mask 404, and perform a third etching process that is designed to etch the dielectric layer 230 with minimal or no etching to the etch mask 404. The multiple etching processes may include wet etching, dry etching, or a combination of wet etching and dry etching. In some embodiments, an etching process in the operation 520 may etch more than one dielectric layer. When the dielectric layer 230 is etched, a slight over-etching is performed to ensure that the top surface of the MRAM cell 249 and the top surface of the metal lines 217 are exposed.

Because the openings 406A are generally much larger than the openings 406B, etching of the dielectric layers 234, 232, and/or 230 may proceed at different etching rates between the MRAM region 100A and logic region 100B (referred to as etch loading effects). For example, the dielectric layer 234 (or 232 or 230) may be etched faster in the MRAM region 100A than in the logic region 100B. Particularly, the dielectric layer 230 is etched faster in the MRAM region 100A than in the logic region 100B due to the etch loading effects. As a result, the dielectric layer 216 may be etched as well, resulting in dips 160 in the dielectric layer 216 between adjacent MRAM cells 249. In some embodiments, the dips 160 may have a depth d4 that is less than 50 nm, such as about 5 nm to about 50 nm, from the top surface of the dielectric layer 216 before etching. If the depth d4 is too large (such as more than 50 nm), the loss of the dielectric layer 216 might be too great and the coupling capacitance between the adjacent MRAM cells 249 might be undesirably high. In some embodiments, the dips 160 may be substantially equal to 0 nm by controlling the various etching parameters. In some embodiments, the dips 160 may extend below the top surface of the MTJ 150. In some embodiments, the TE 228 is partially removed by the etching processes. In some alternative embodiments, the TE 228 is completely removed and the top surface of the MTJ 150 is exposed. As shown in FIGS. 3K and 3K-1, the operation 520 extends the openings 406A and 406B into the dielectric layers 234/232/230. Particularly, the opening (or trenches) 406A extends continuously from a first one of the MRAM cells 249 to a last one of the MRAM cells 249 in a same column of an MRAM array (which may have hundreds or thousands of MRAM cells 249 in some embodiments). After the MRAM cells 249 and the metal lines 217 are exposed, the etch mask 404 may be removed.

Figure 3L:
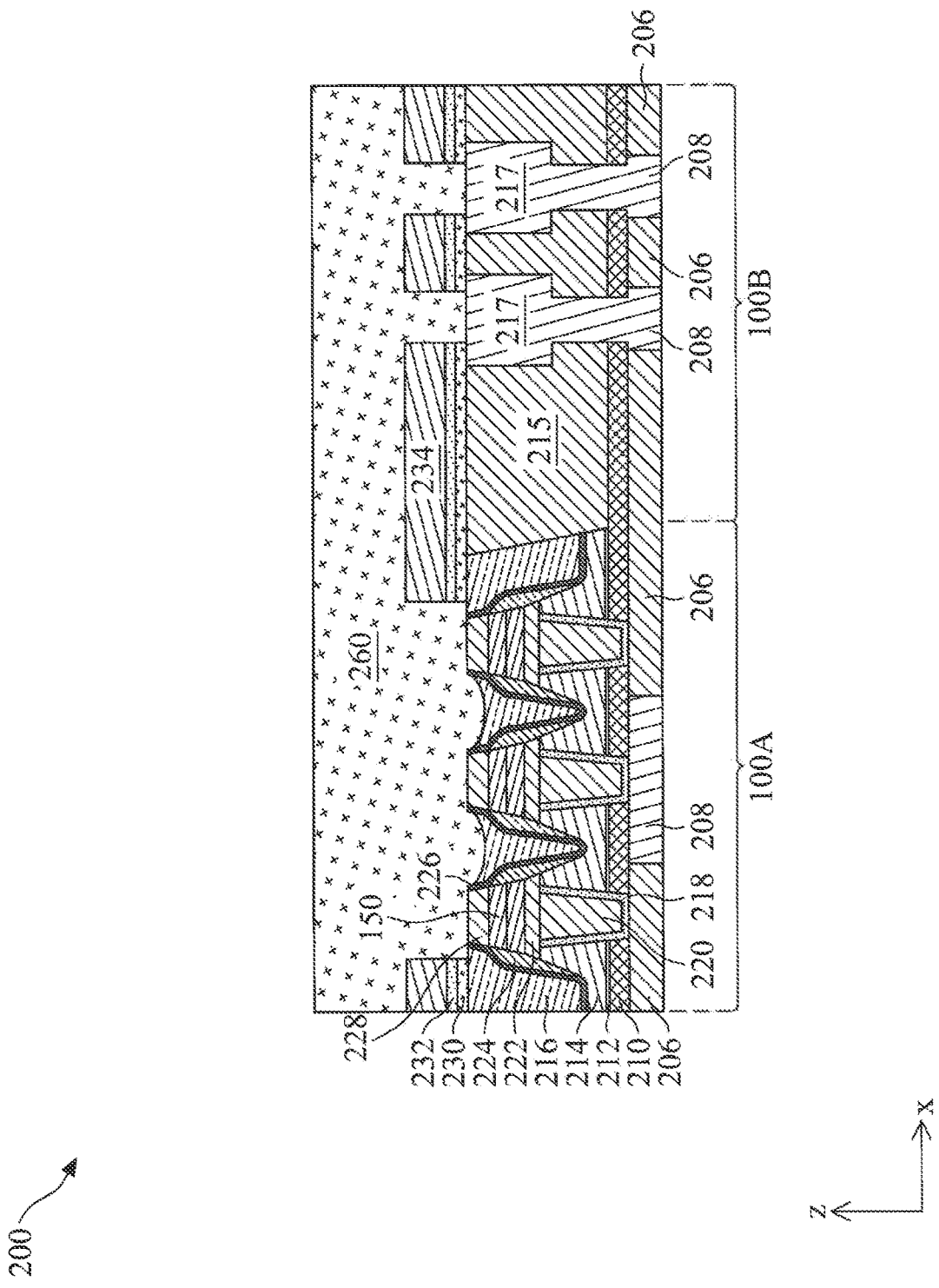
Figure 7:
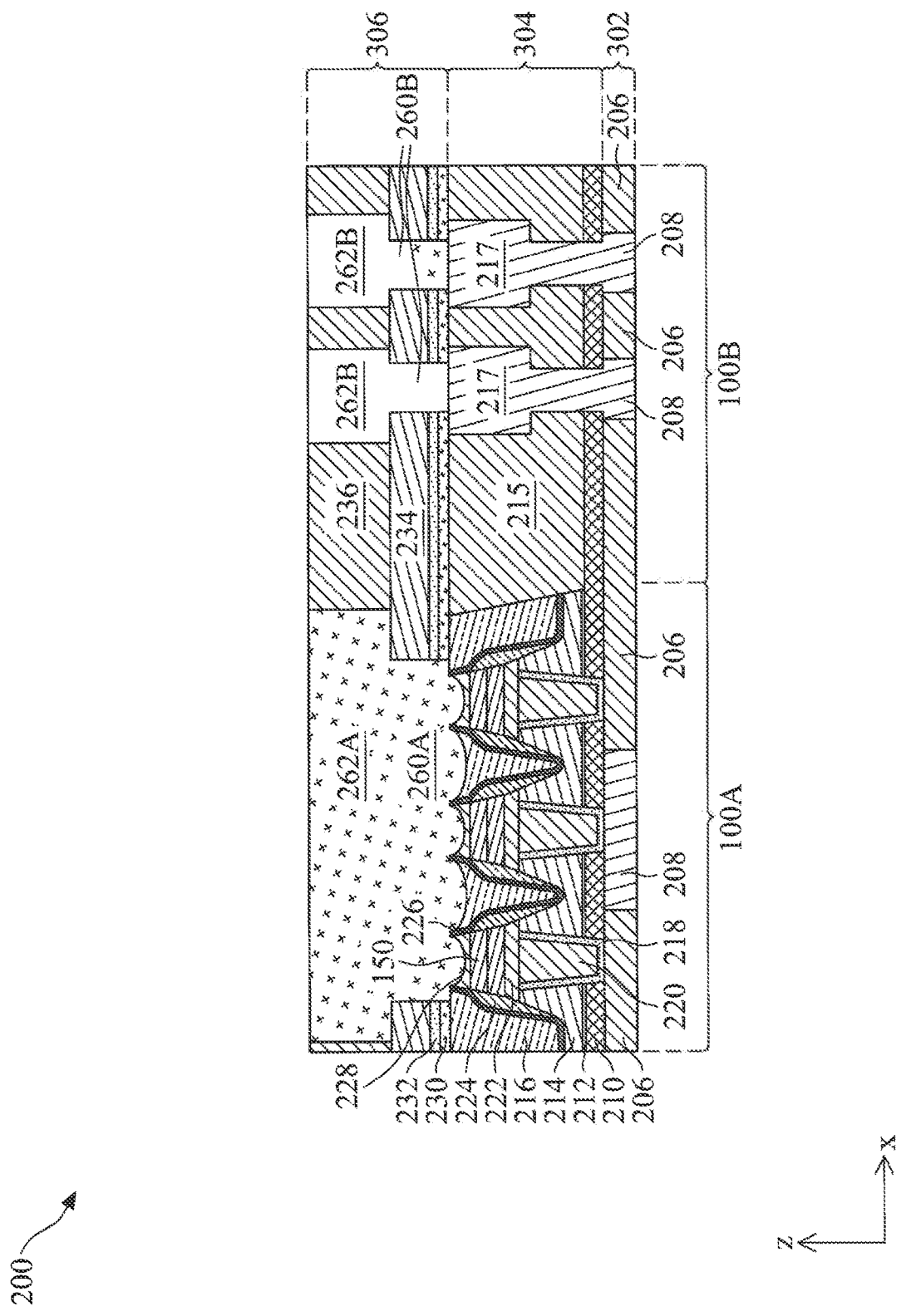
Figure 8:
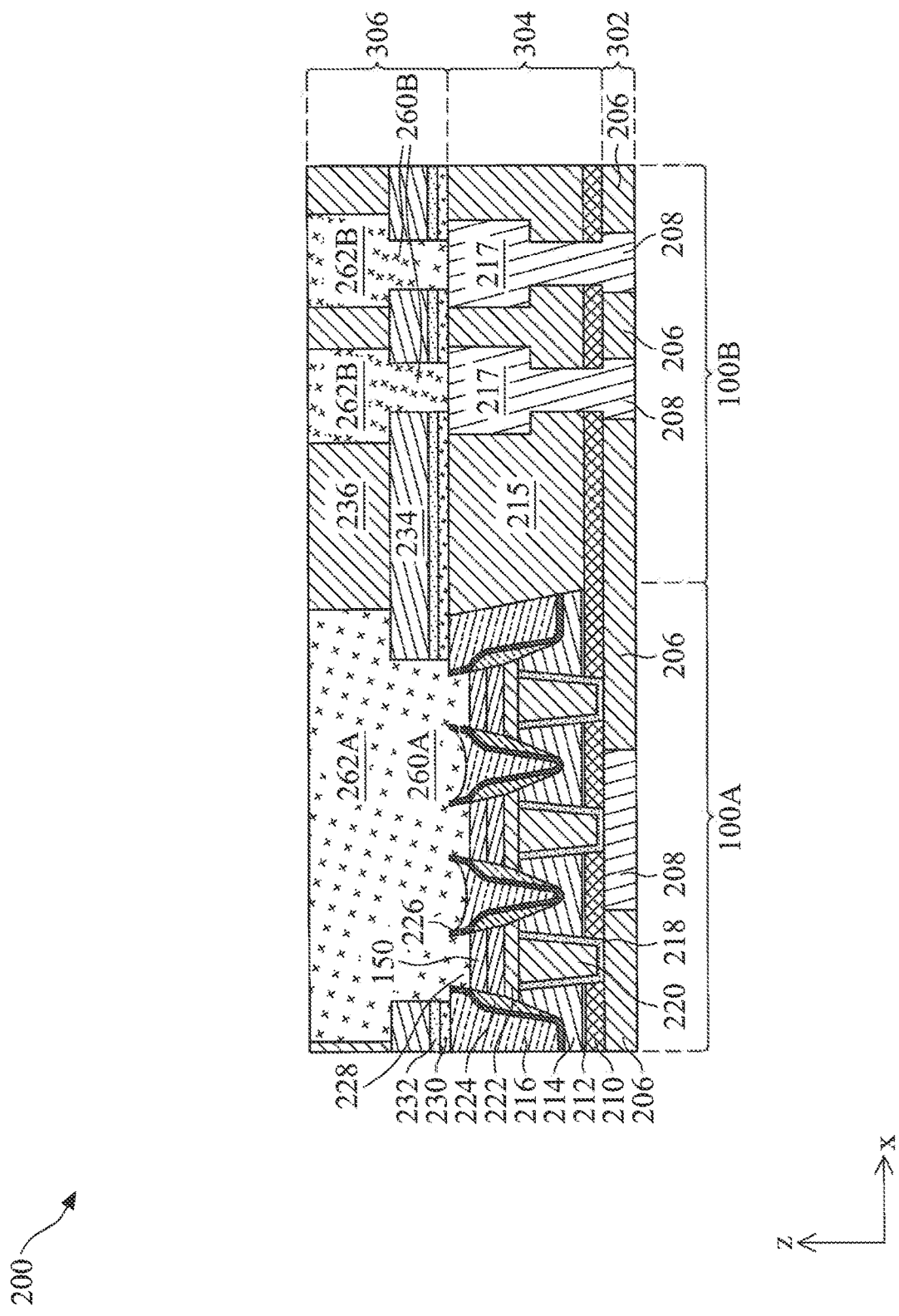

At operation 522, the method 500 (FIG. 2B) form vias in the openings 406A and 406B. For example, the operation 522 may deposit one or more metallic materials 260 into the openings 406A and 406B and over the top surface of the dielectric layer 234, such as shown in FIG. 3L. The one or more metallic materials 260 also fill in the dips 160. In embodiments (such as shown in FIGS. 7 and 8) where the TE 228 are partially or completely removed by the operation 518, the one or more metallic materials 260 also fill space directly above the MTJ 150 and between the dielectric layer 226 on two opposing sidewalls of the MRAM cell 249. The one or more metallic materials 260 may include a barrier layer or a seed layer having Ta, TaN, Ti, TiN, or other suitable conductive material and a low-resistance fill metal such as copper, aluminum, or other suitable metal.

Figure 3M:
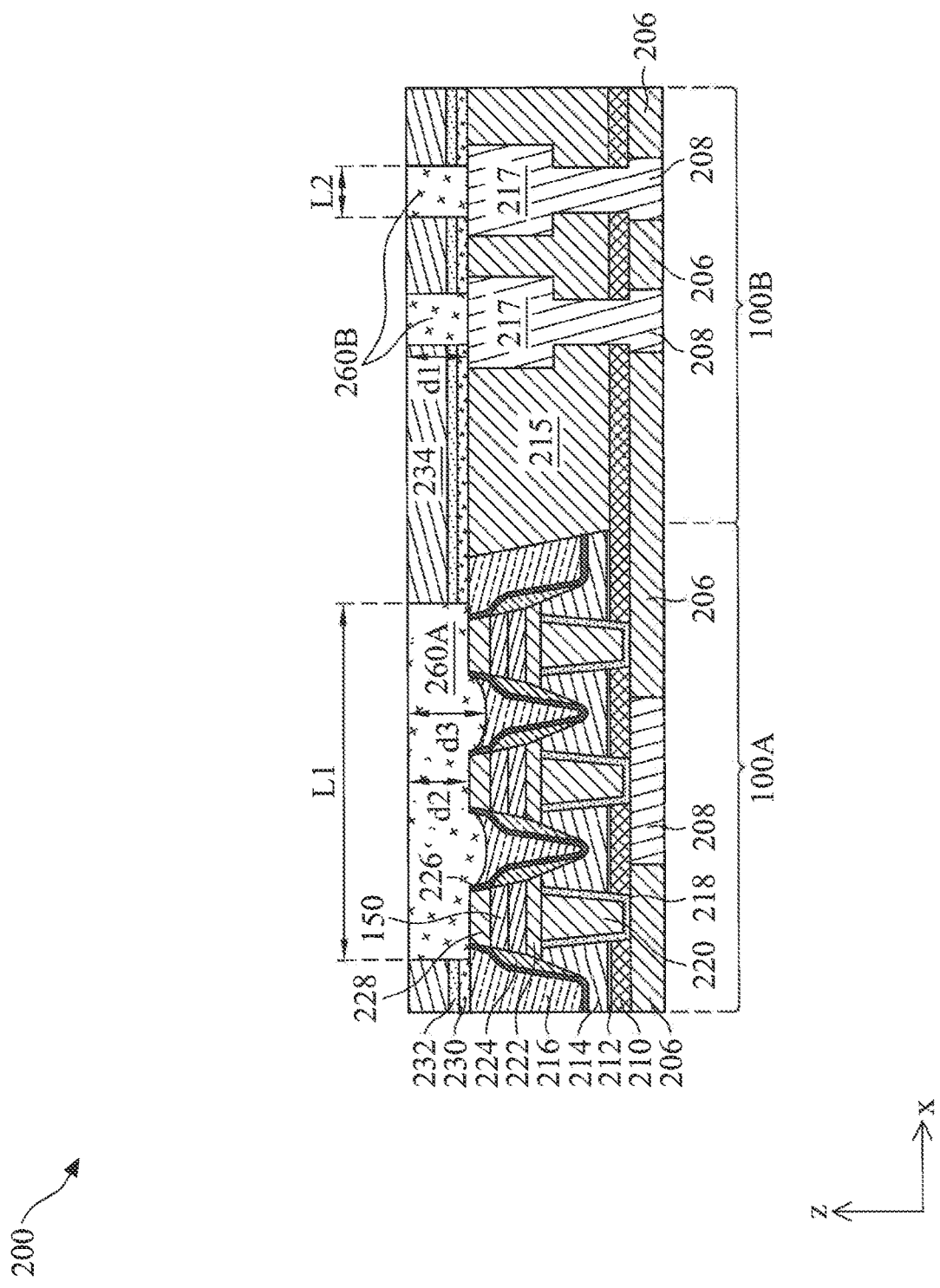
Figures 1, 3M:
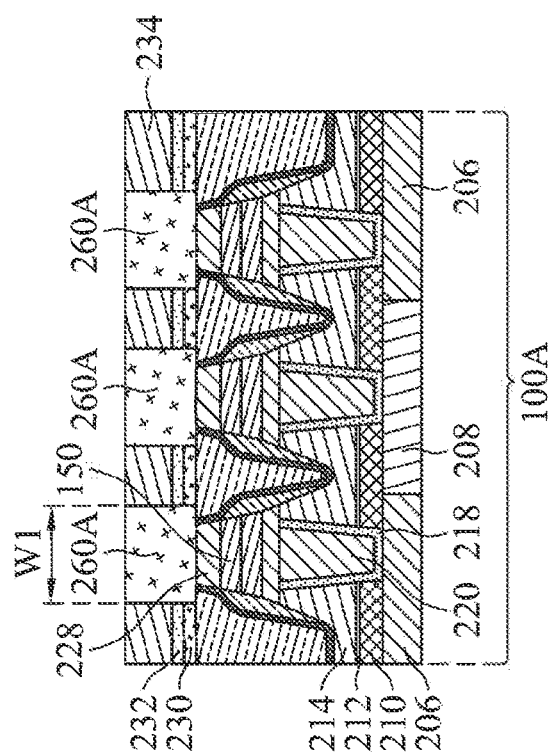

Subsequently, the operation 522 performs a CMP process to the one or more metallic materials 260 to remove them from the top surface of the dielectric layer 234. The resultant structure of the device 200 is shown in FIGS. 3M and 3M-1 according to an embodiment. FIG. 3M illustrates the device 200 along the B-B line in FIG. 1B (i.e., along the "x" direction), and FIG. 3M-1 illustrates the device 200 along the A-A line in FIG. 1B (i.e., along the "y" direction perpendicular to the "x" direction). Remaining portions of the one or more metallic materials 260 in the opening (or trench) 406A become the slot via 260A. Remaining portions of the one or more metallic materials 260 in the opening (or trench) 406B become the vias 260B. As shown in FIG. 3M, the slot via 260A has a length L1 along the "x" direction. As shown in FIG. 3M-1, the slot via 260A has a width W1 along the "y" direction. In some embodiments, the length L1 is in a range of about 100 nm to about 10,000 nm, the width W1 is in a range of about 20 nm to about 100 nm, and the length L2 of the via 260B along the "x" direction is about 20 nm to about 60 nm. In some embodiments, a ratio of the length L1 to the length L2 is about 5 to 500. Therefore, the slot via 260A provide a much lower series resistance than the via 260B. In some embodiments, the length of the MTJ 150 along the "x" direction is in a range of about 20 nm to about 100 nm. In the present embodiment, the length L1 is about equal to or greater than the number of the MTJs 150 in the same column multiplying the sum of the length of the MTJ 150 and the pitch of the MTJs 150. Further, the slot via 260A has a thickness d2 directly above the MTJ 150 and a thickness d3 directly above the space between two adjacent MTJs 150, and the via 260B has a thickness d1. In an embodiment, the thickness d2 is equal to or greater than the thickness d1, and the thickness d3 is greater than the thickness d1. In some embodiments, the thickness d3 is equal to or greater than the thickness d2. For example, the thickness d3 is greater than the thickness d2 by about 5 nm to about 50 nm in some embodiments. In some examples, the thickness d2 is in a range of 40 nm to 80 nm, and the thickness d3 is in a range of 45 nm to 130 nm.

Figure 3N:
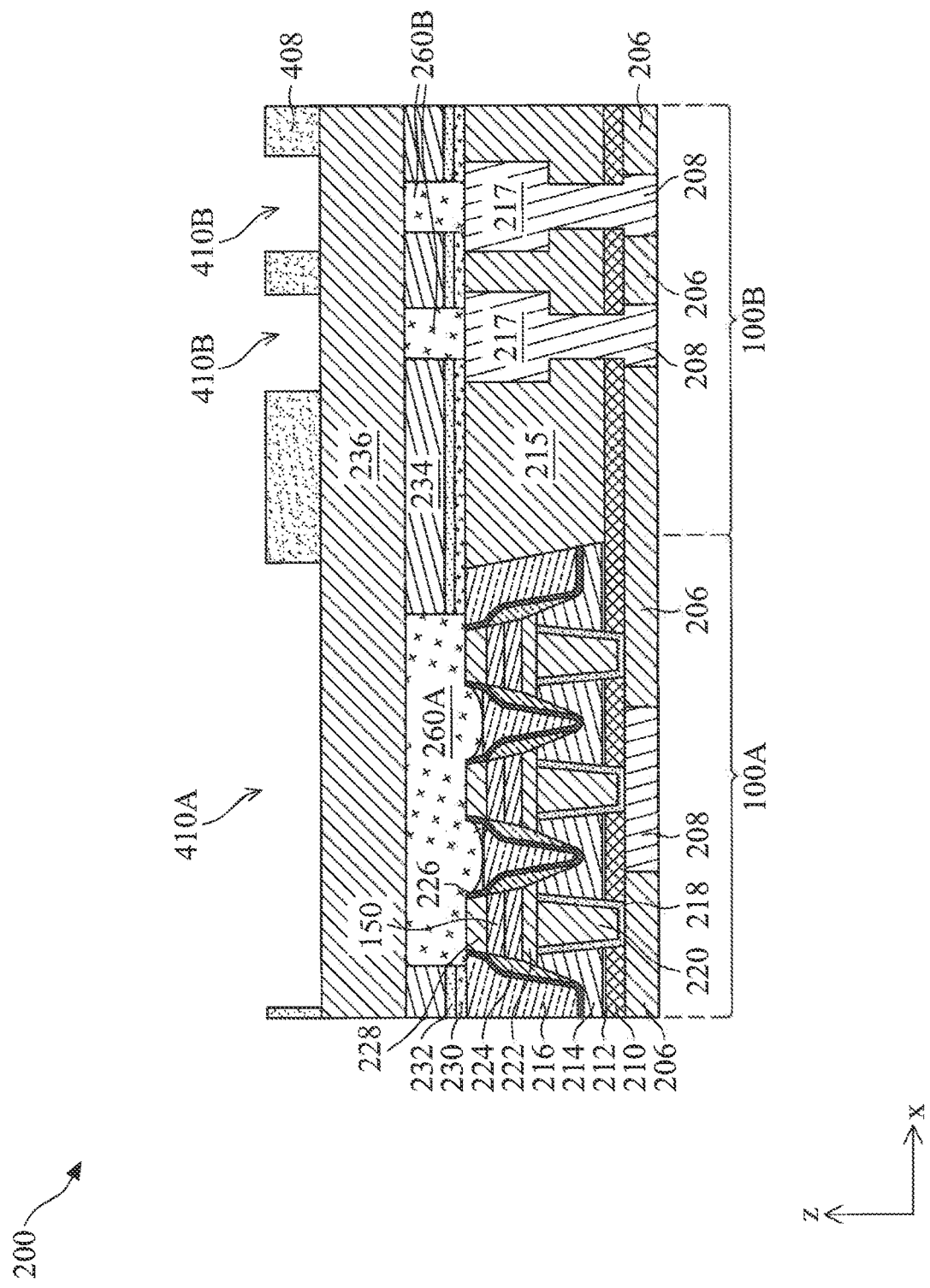

At operation 524, the method 500 (FIG. 2B) deposits a dielectric layer 236 over the vias 260A and 260B and over the dielectric layer 234 in both the MRAM region 100A and the logic region 100B, such as shown in FIG. 3N. In an embodiment, the dielectric layer 236 includes one or more oxide based dielectric materials such as silicon dioxide, tetraethylorthosilicate (TEOS) formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials, and may be deposited using CVD, PVD, or other suitable methods. Then, the operation 524 forms an etch mask 408 over the dielectric layer 236, such as shown in FIG. 3N. The etch mask 408 provides openings 410A over the slot via 260A and openings 410B over the vias 260B. In an embodiment, the etch mask 408 includes a material that has etch selectivity with respect to the dielectric layer 236 in an etching process. The etch mask 408 may be formed using deposition, photolithography, and etching processes, as discussed above with reference to the etch mask 404.

Figure 3O:
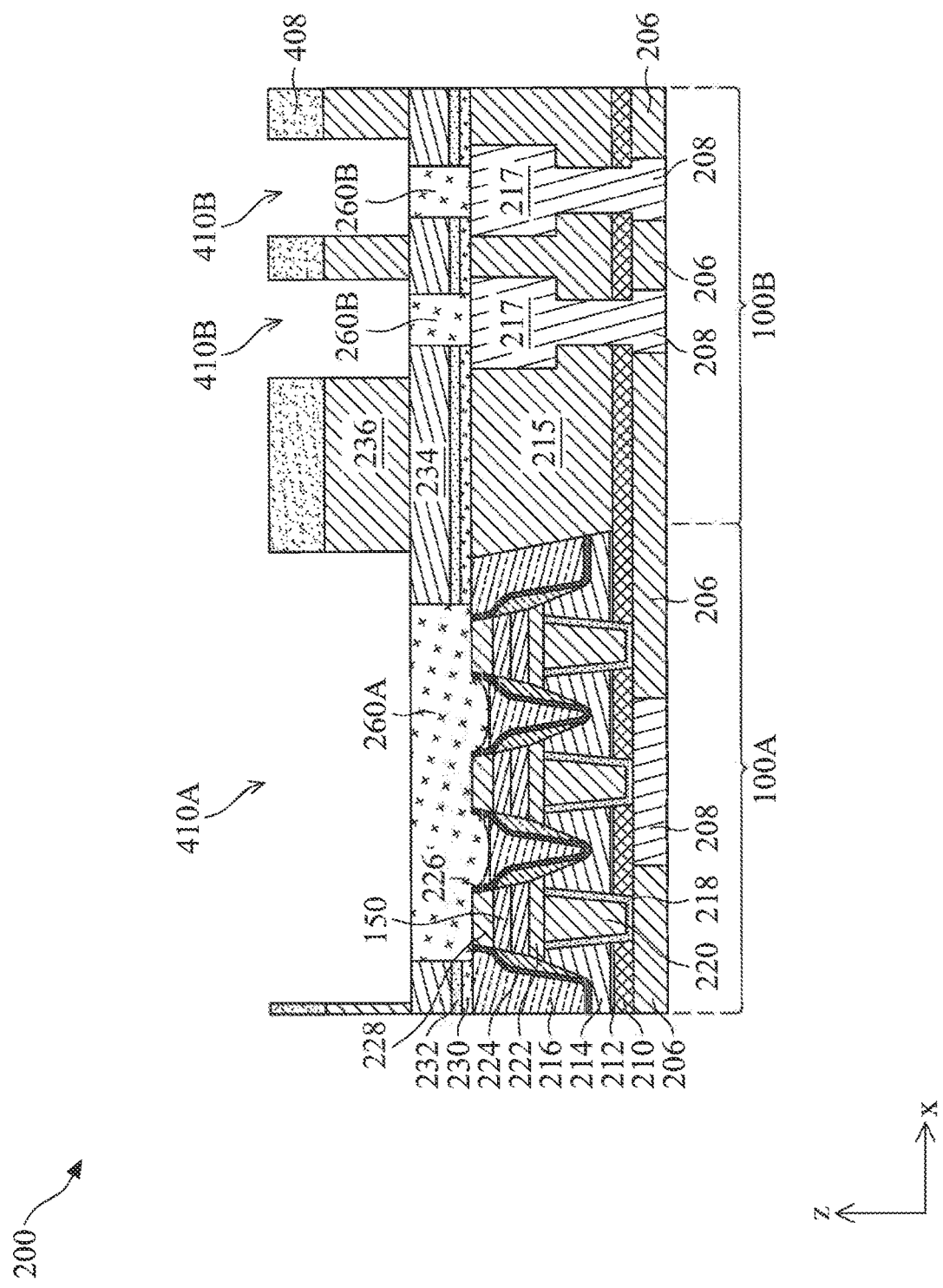

At operation 526, the method 500 (FIG. 2B) etches the dielectric layer 236 through the etch mask 408 to expose the slot via 260A in the MRAM region 100A and the vias 260B in the logic region 100B, such as shown in FIG. 3O. The etching process may use a wet etching, dry etching, or a combination of wet etching and dry etching. The etching process extends the openings 410A and 410B through the dielectric layer 236 until the top surface of the slot via 260A and the top surface of the vias 260B are exposed. The openings 410A and 410B are wider than the slot via 260A and the vias 260B, respectively, along the "x" direction. Subsequently, the etch mask 408 is removed.

At operation 528, the method 500 (FIG. 2B) form metal lines in the openings 410A and 410B. For example, the operation 528 may deposit one or more metallic materials 262 into the openings 410A and 410B and over the top surface of the dielectric layer 236, such as shown in FIG. 3P. The one or more metallic materials 262 may include a barrier layer or a seed layer having Ta, TaN, Ti, TiN, or other suitable conductive material and a low-resistance fill metal such as copper, aluminum, or other suitable metal.

Figure 3Q:
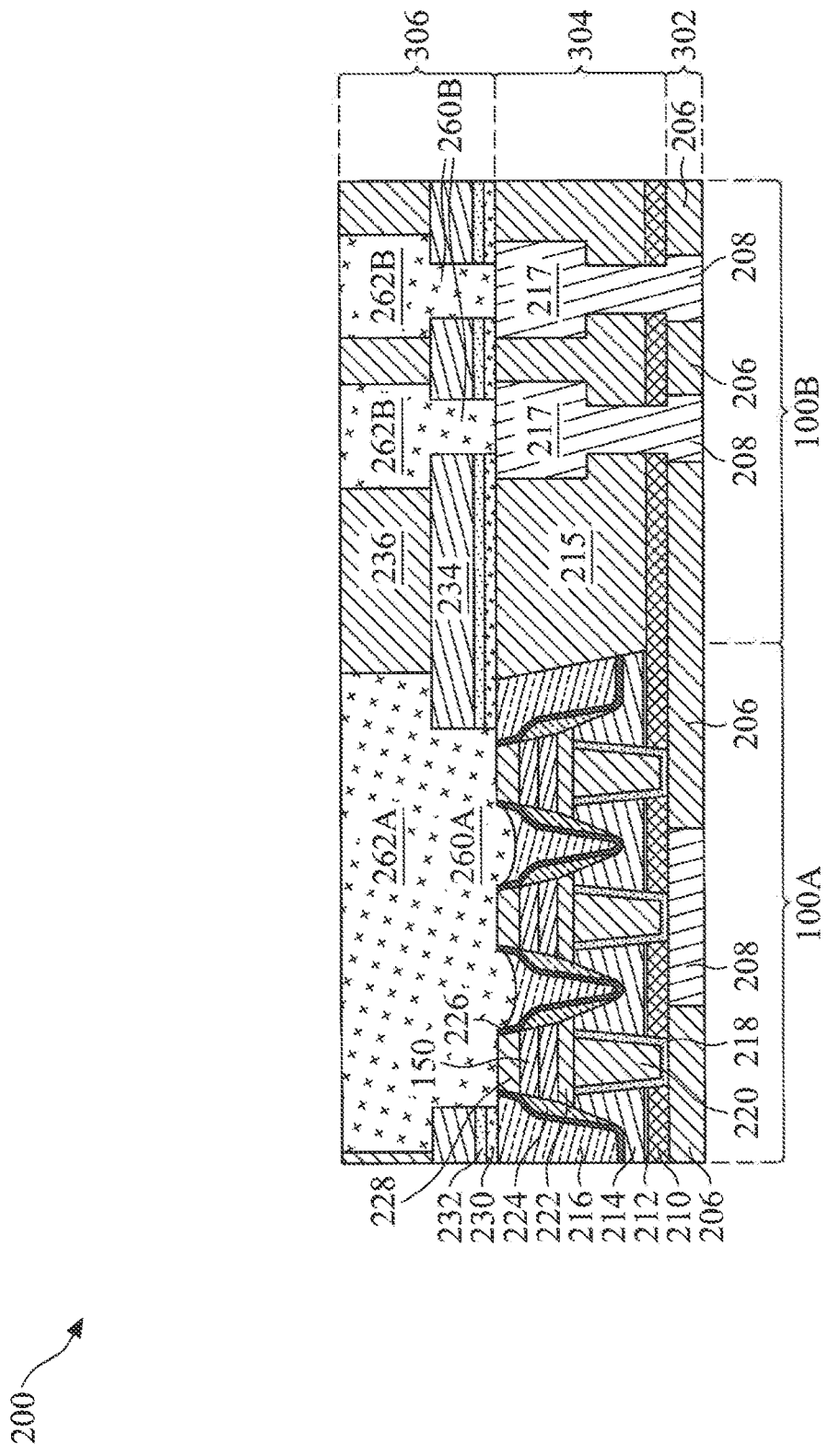

Subsequently, the operation 528 performs a CMP process to the one or more metallic materials 262 to remove them from the top surface of the dielectric layer 236. The resultant structure of the device 200 is shown in FIG. 3Q according to an embodiment. Remaining portions of the one or more metallic materials 262 in the opening (or trench) 410A become the metal line 262A. Remaining portions of the one or more metallic materials 262 in the opening (or trench) 410B become the metal lines 262B. The metal line 262A is slightly longer than the slot via 260A along the "x" direction. The metal line 262B is slightly longer than the via 260B along the "x" direction. Using the operations 516 through 528, the metal layer 306 is thus formed over the metal layer 304.

At operation 530, the method 500 (FIG. 2B) performs further fabrication to the device 200, such as forming one or more metal layers over the metal layer 306, forming passivation layer(s), and performing more back end of processes.

Figure 4A:
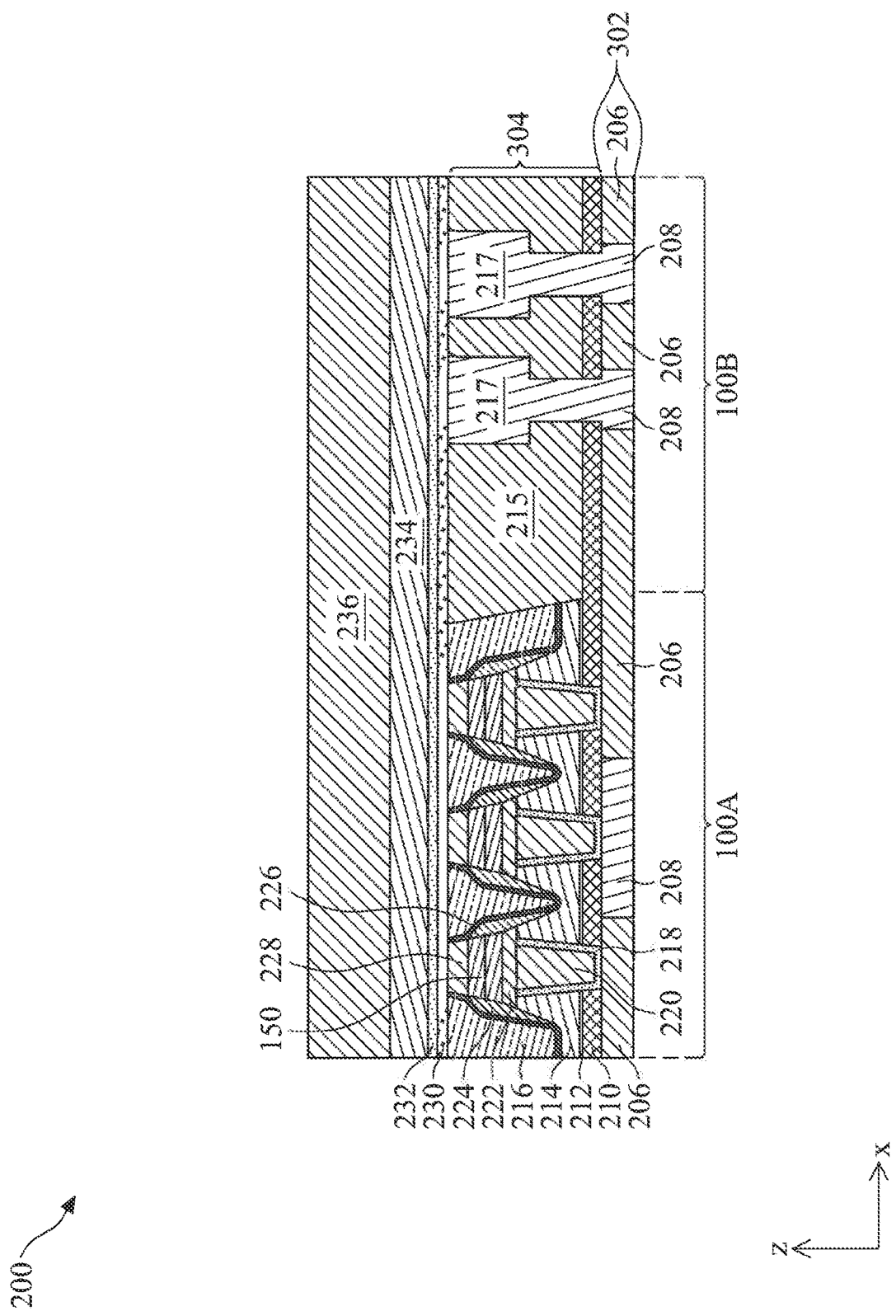
FIGS. 4A, 4B, 4C, 4D, 4E, 5A, and 5B illustrate cross-sectional views of a semiconductor structure during fabrication processes according to the method of FIG. 2C, in accordance with some embodiments.
Figure 4B:
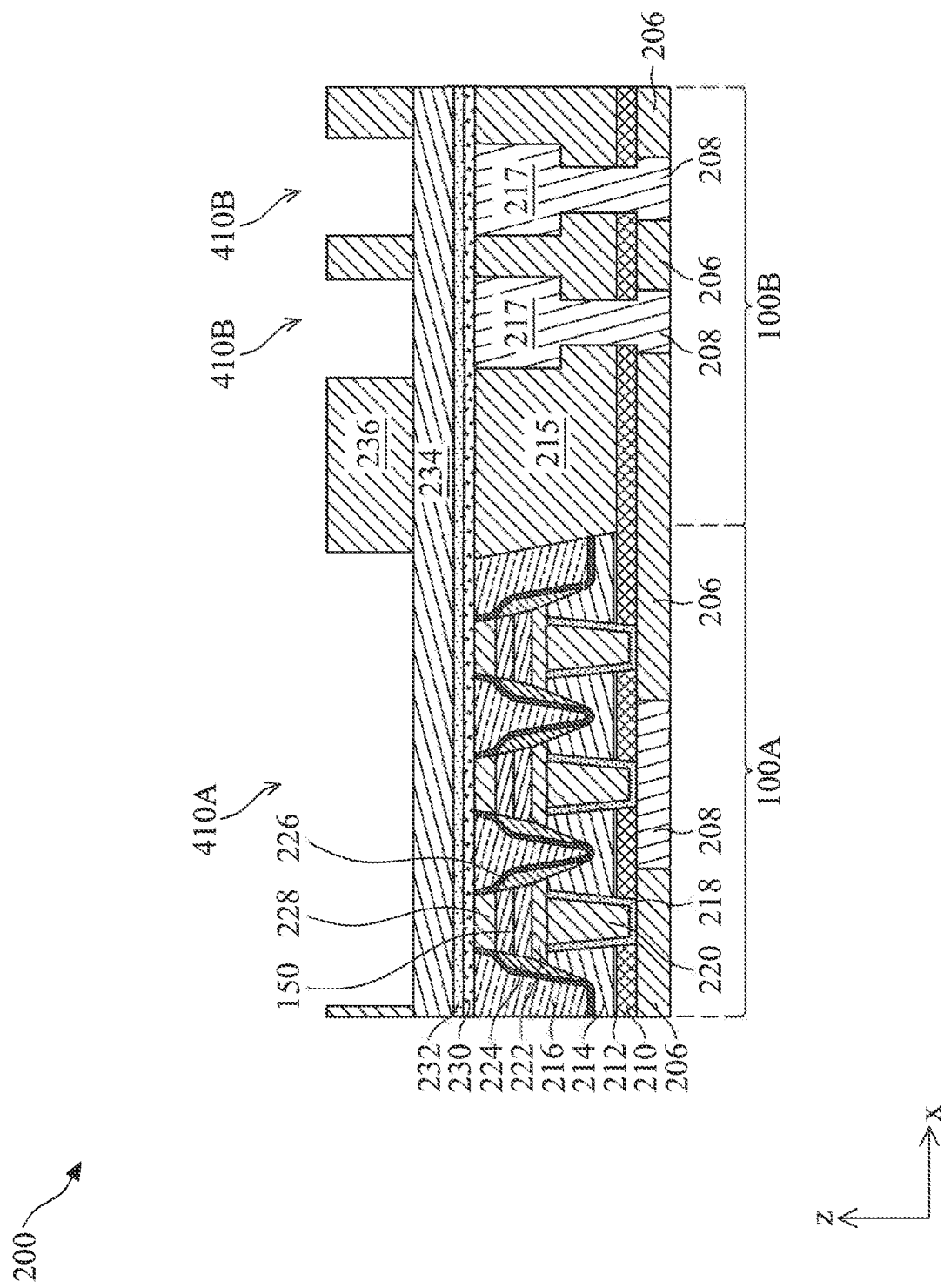
Figure 4C:
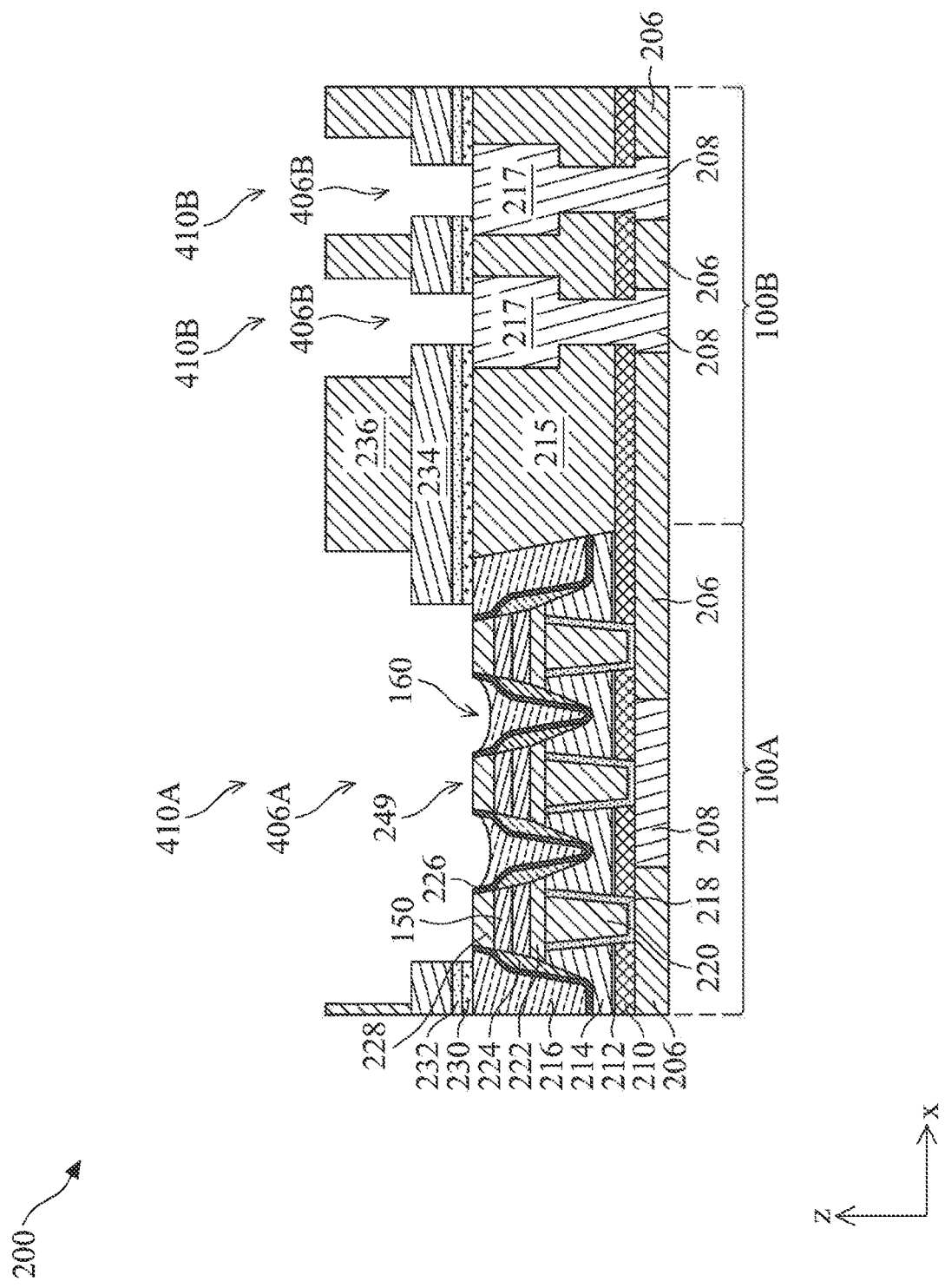
Figure 4D:
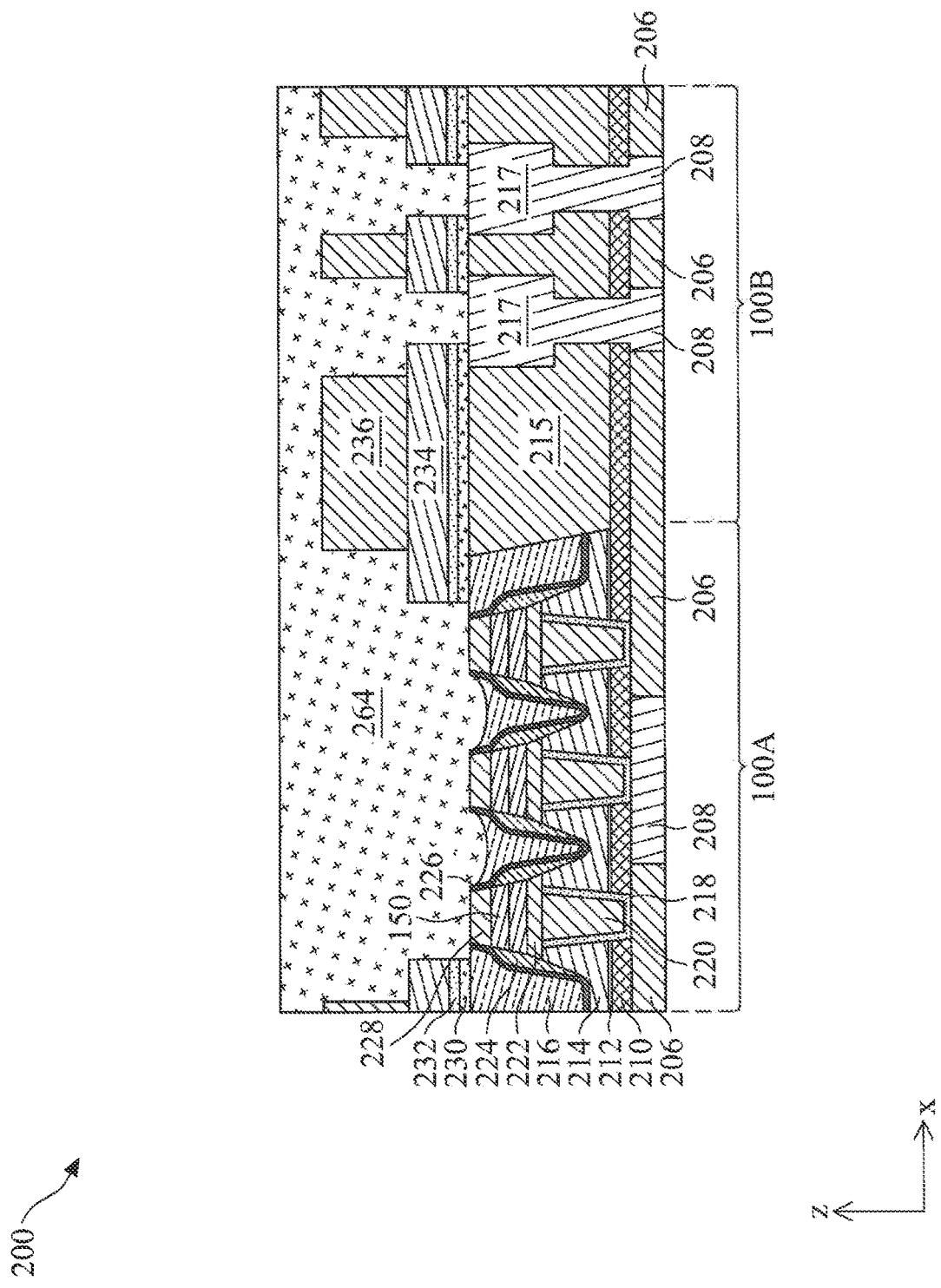
Figure 4E:
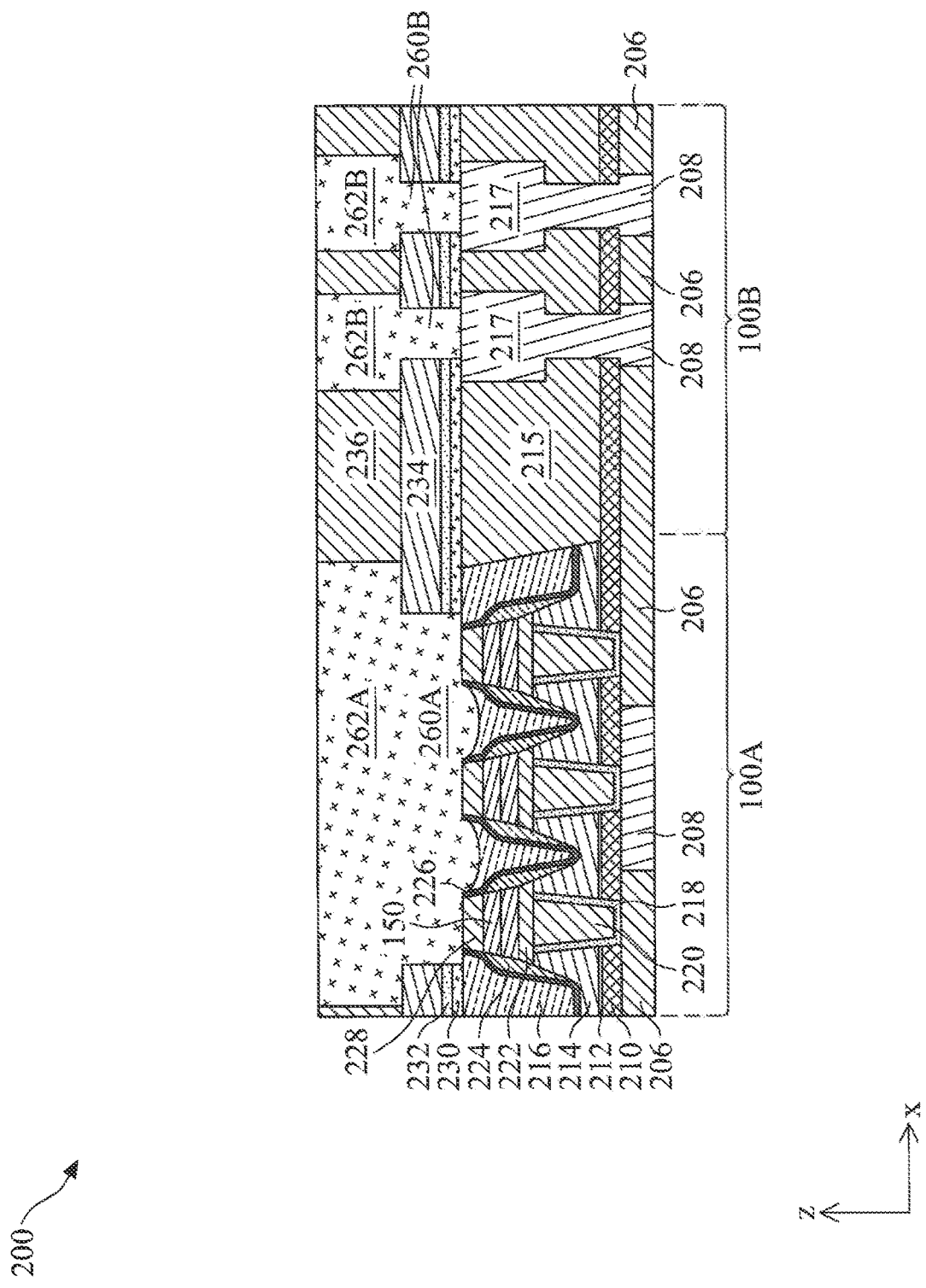

FIGS. 2A and 2C illustrate the method 500 in an alternative embodiment, which is briefly described below. Referring to FIG. 2C, after the operation 514 has finished as discussed above, the method 500 proceeds to operation 540 to deposit dielectric layers 230, 232, 234, and 236, such as shown in FIG. 4A. Then, at operation 542, the method 500 (FIG. 2C) etches the dielectric layer 236 to form the openings (or trenches) 410A and 410B, such as shown in FIG. 4B. For example, the operation 542 may form an etch mask such as the etch mask 408 shown in FIG. 3N, and then etch the dielectric layer 236 through the etch mask until the dielectric layer 234 is exposed. The etch mask is subsequently removed. At operation 544, the method 500 (FIG. 2C) etches the dielectric layers 234, 232, and 230 to form the openings (or trenches) 406A and 406B, such as shown in FIG. 4C. For example, the operation 544 may form an etch mask such as the etch mask 404 shown in FIG. 3J, and then etch the dielectric layers 234, 232, and 230 through the etch mask until the MTJs 150 and the metal lines 217 are exposed. The etch mask is subsequently removed. This operation is similar to the operation 520. Then, at operation 546, the method 500 (FIG. 2C) forms the vias 260A and 260B and the metal lines 262A and 262B. For example, the operation 546 may deposit one or more metallic materials 264 into the openings 406A, 406B, 410A, and 410B, as well as over the top surface of the dielectric layer 236, such as shown in FIG. 4E. The one or more metallic materials 264 also fill in the dips 160. Then, the operation 546 performs a CMP process to the one or more metallic materials 264 to remove them from the top surface of the dielectric layer 236. The resultant structure of the device 200 is shown in FIG. 4E. Remaining portions of the one or more metallic materials 264 in the opening (or trench) 406A, 406B, 410A, and 410B become the slot via 260A, the vias 260B, the metal line 262A, and the metal lines 262B, respectively. Then, at operation 530, the method 500 (FIG. 2C) proceeds to further fabrications.

Figure 5A:
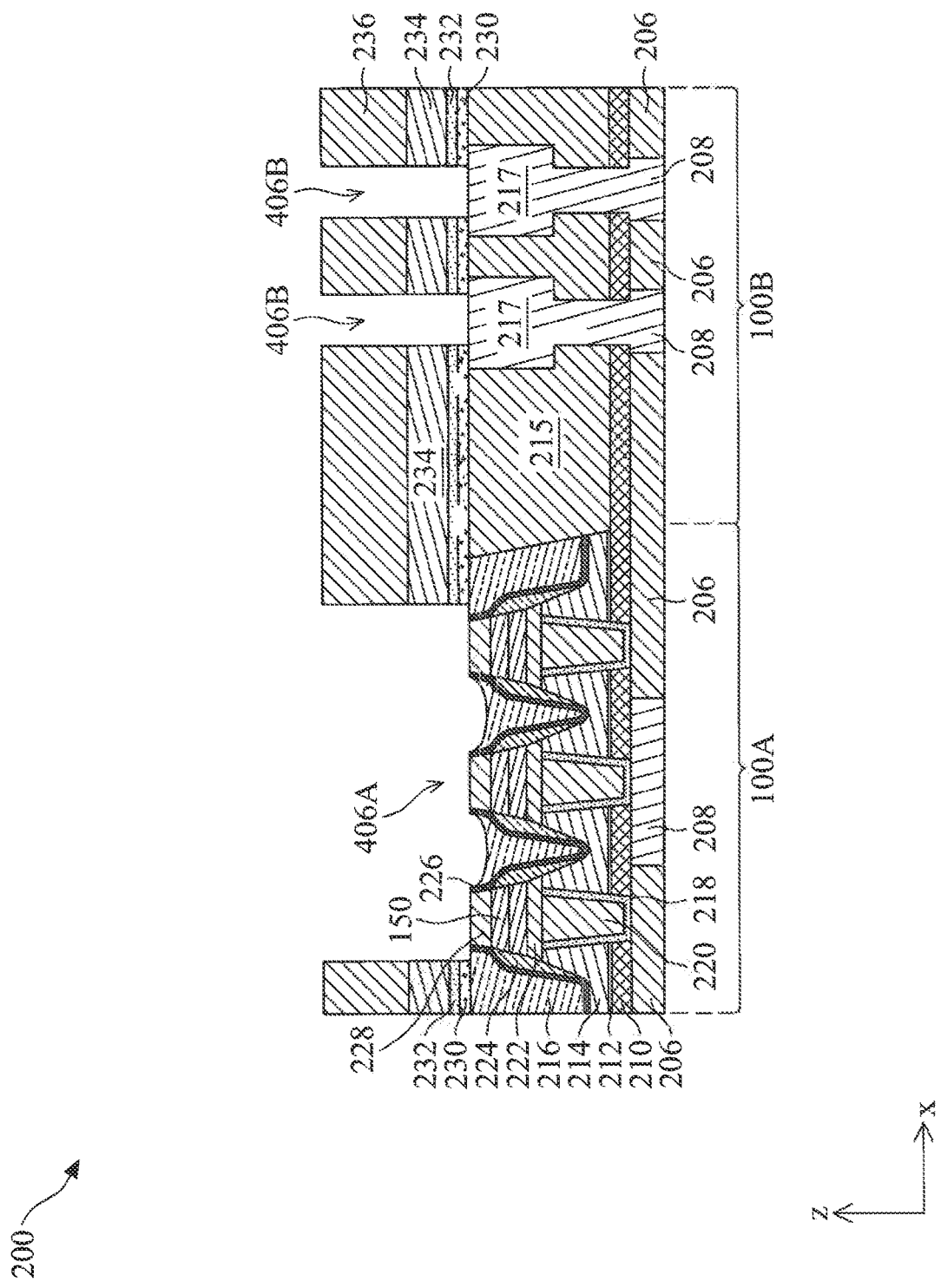
Figure 5B:
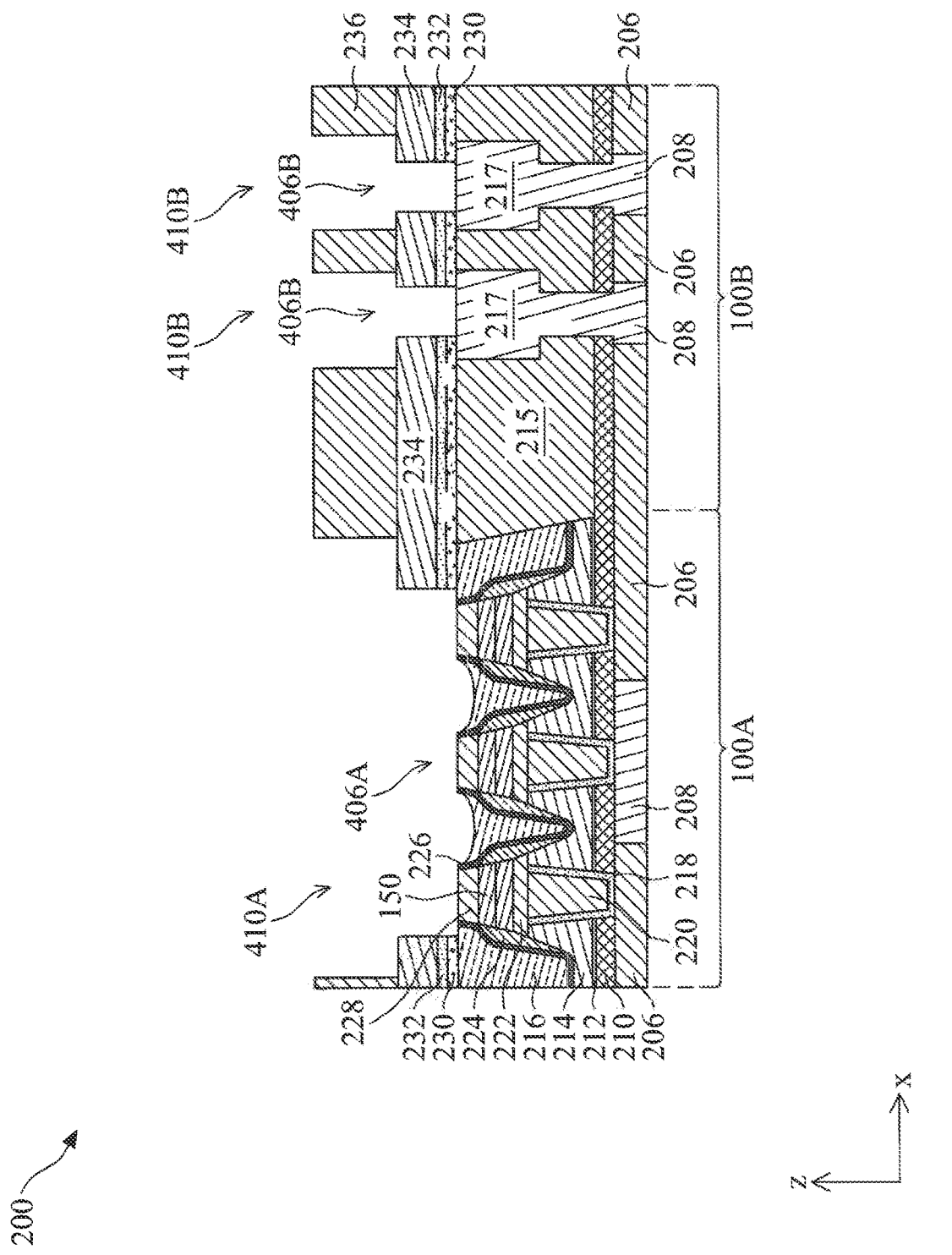

In another embodiment, the operations 544 may be performed before the operation 542. For example, after the operation 540 has deposited the dielectric layers 230, 232, 234, and 236, the method 500 may proceed to the operation 544 to etch the dielectric layers 230, 232, 234, and 236 to form the openings (or trenches) 406A and 406B, such as shown in FIG. 5A. This operation is similar to the operation 520. Then, the method 500 may proceed to the operation 542 to etch the dielectric layer 236 to form the openings (or trenches) 410A and 410B, such as shown in FIG. 5B. Thereafter, method 500 may proceed to the operation 546 to form the vias 260A and 260B and the metal lines 262A and 262B as discussed above.

Figure 6:
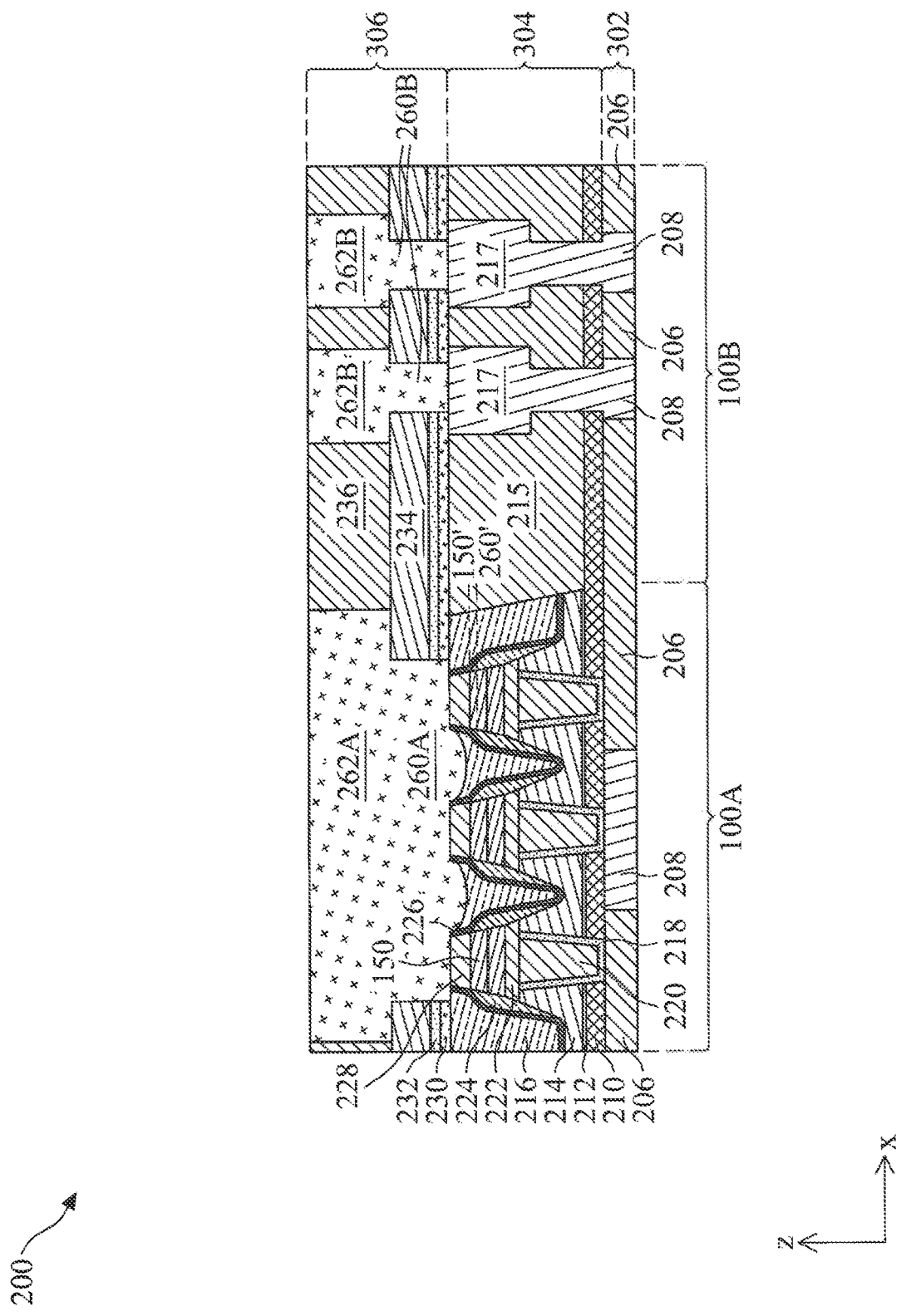
FIGS. 6, 7, 8, and 9 illustrate cross-sectional views of a semiconductor structure, in accordance with some embodiments.

FIG. 6 illustrates an embodiment of the device 200 where the etching process in the operation 520 (or in the operation 544) over-etches the dielectric layer 216 between adjacent MTJs 150 such that the top surface 150' of the MTJ 150 is above the bottom surface 260' of the slot via 260A in space between the adjacent MTJs 150. This advantageously increases the total volume of the slot via 260A for reduced series resistance.

FIG. 7 illustrates an embodiment of the device 200 where the etching process in the operation 520 (or in the operation 544) partially removes the TE 288 such that a portion of the slot via 260A is disposed laterally between the protection layer on two opposing sidewalls of an MTJ 150. This advantageously increases the total volume of the slot via 260A for reduced series resistance.

FIG. 8 illustrates an embodiment of the device 200 where the etching process in the operation 520 (or in the operation 544) completely removes the TE 288 such that a portion of the slot via 260A is disposed laterally between the protection layer on two opposing sidewalls of an MTJ 150 and directly on top of the MTJ 150. This advantageously increases the total volume of the slot via 260A for reduced series resistance.

Figure 9:
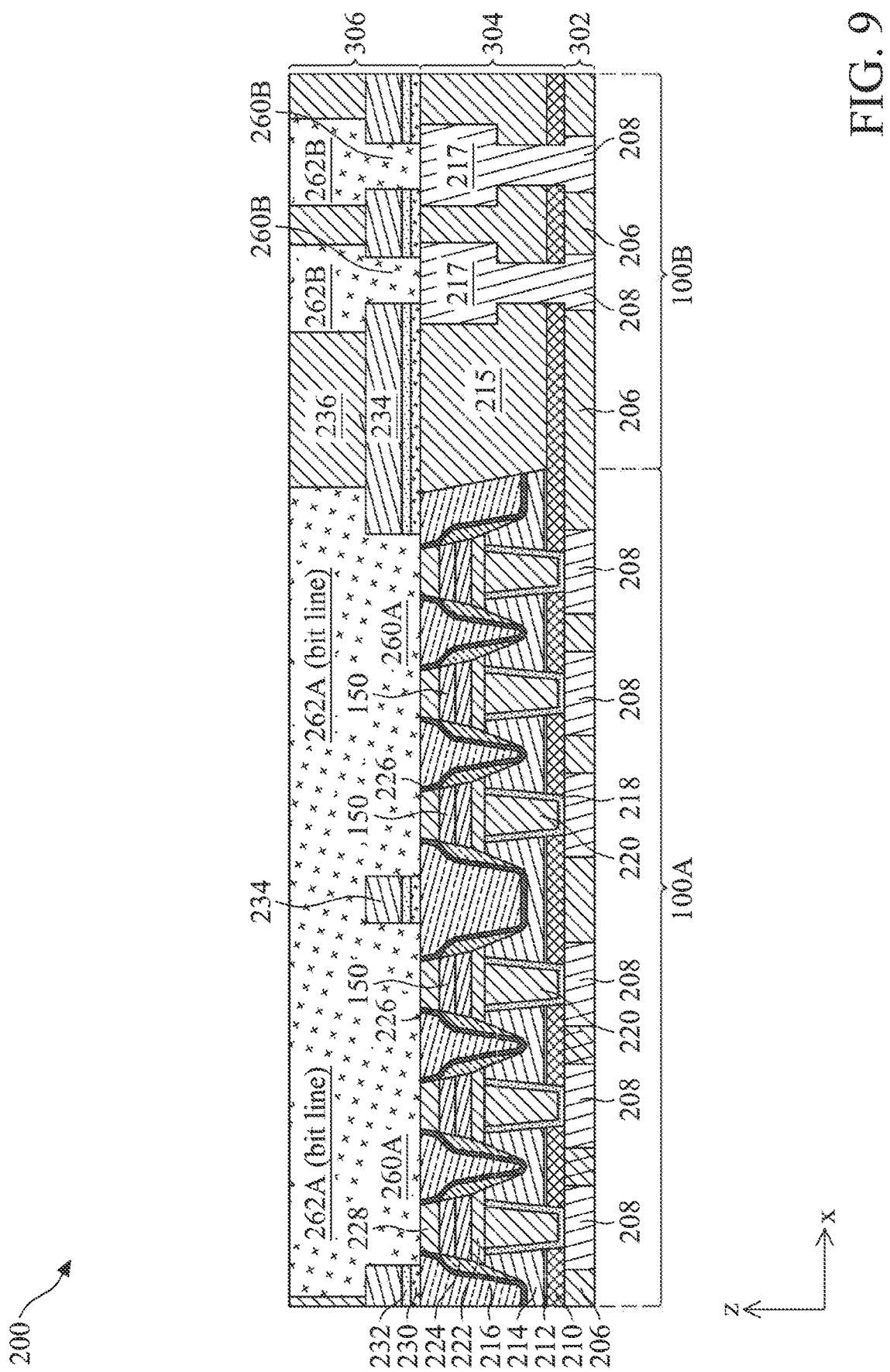

FIG. 9 illustrates an embodiment of the device 200 where multiple slot vias 260A are connected by a common metal line 262A to function as a bit line or a part of a bit line. Due to the presence of the slot vias 260A, the series resistance of the bit line is greatly reduced. In various embodiments, a bit line in the device 200 may include one slot via 260A or multiple slot vias 260A (such as two, three, four, and so on), depending on design considerations such as mask making complexity and etching balance among various areas in the device 200. In the embodiment depicted in FIG. 9, the dipping in the dielectric layer 216 between the adjacent MRAM cells 249 is negligible (about 0 nm). In other words, the bottom surface of the slot via 260A and the top surface of the dielectric layer 216 are substantially planar. In an alternative embodiment, the dipping in the dielectric layer 216 between the adjacent MRAM cells 249 may be in a range of about 5 nm to about 50 nm, such as the embodiments depicted in FIGS. 7 and 8 (in other words, the bottom of the slot via 260A extends below the top surface of the dielectric layer 216). Further, in the embodiment depicted in FIG. 9, the TE 228 has a top surface that is substantially coplanar with the bottom surface of the slot via 260A and the top surface of the dielectric layer 216. In an alternative embodiment, the TE 228 may be partially or completely removed and the space therein is filled with the slot via 260A, such as the embodiments depicted in FIGS. 7 and 8.

Although not intended to be limiting, one or more embodiments of the present disclosure provide many benefits to a semiconductor device and the formation thereof. For example, embodiments of the present disclosure provide a semiconductor device with an MRAM array in an MRAM region. The MRAM array is provided with a slot via that extends continuously above a column of MRAM cells in the MRAM array and has a thickness that is equal to or greater than vias in the same metal layer in a logic region. The slot via advantageously reduces the series resistance of the bit line for the column of the MRAM cells. Furthermore, formation of this semiconductor device can be readily integrated into existing semiconductor fabrication processes.

In one example aspect, the present disclosure is directed to a semiconductor structure that includes a first metal layer, a second metal layer disposed over the first metal layer, and a third metal layer disposed immediately above the second metal layer. The second metal layer includes multiple magnetic tunneling junction (MTJ) devices in a memory device region and a first conductive feature in a logic device region. Each of the MTJ devices includes a bottom electrode and an MTJ stack disposed over the bottom electrode. The third metal layer includes a first via disposed over and electrically connecting to the first conductive feature, and a slot via disposed over the MTJ devices and electrically connecting to the MTJ stack of each of the MTJ devices. The slot via occupies a space extending continuously and laterally from a first one of the MTJ devices to a last one of the MTJ devices. A first thickness of the first via is equal to or less than a second thickness of the slot via directly above the MTJ stack of one of the MTJ devices. The third metal layer further includes a second conductive feature disposed over and electrically connecting to the first via, and a third conductive feature disposed over and electrically connecting to the slot via.

In an embodiment of the semiconductor structure, both the slot via and the first via include copper. In a further embodiment, both the second and the third conductive features include copper.

In an embodiment of the semiconductor structure, the second metal layer includes a dielectric feature laterally disposed between two adjacent ones of the MTJ devices, and a third thickness of the slot via directly above the dielectric feature is greater than the second thickness. In a further embodiment, the third thickness is greater than the second thickness by about 5 nm to about 50 nm.

In an embodiment of the semiconductor structure, one of the MTJ devices further includes a top electrode vertically between the slot via and the MTJ stack of the one of the MTJ devices. In another embodiment, a portion of the slot via extends to a level lower than a top surface of the MTJ stack of one of the MTJ devices In another embodiment, each of the MTJ devices further includes a spacer on sidewalls of the MTJ stack of the respective MTJ device, and a protection layer on sidewalls of the spacer, wherein a portion of the slot via is disposed in a space laterally between the protection layer of two adjacent ones of the MTJ devices. In a further embodiment, a bottom surface of the portion of the slot via is substantially flat.

In another example aspect, the present disclosure is directed to a method that includes providing a structure having a first metal layer and a second metal layer disposed over the first metal layer, wherein the second metal layer includes multiple magnetic tunneling junction (MTJ) devices in a memory device region and a first conductive feature in a logic device region, wherein each of the MTJ devices includes a bottom electrode, an MTJ stack disposed over the bottom electrode, and a top electrode disposed over the MTJ stack. The method further includes forming one or more dielectric layers over the second metal layer; forming a first etch mask over the one or more dielectric layers, wherein the first etch mask defines a first hole above the first conductive feature and a second hole above the MTJ devices and extending continuously from a first one of the MTJ devices to a last one of the MTJ devices; and etching the one or more dielectric layers through the first and the second holes to form a first trench and a second trench, respectively, in the one or more dielectric layers, wherein the first trench exposes the first conductive feature and the second trench exposes a portion of each of the MTJ devices. The method further includes depositing a first metallic material into the first and the second trenches and above the one or more dielectric layers; and performing a chemical mechanical planarization process to the first metallic material such that a first portion of the first metallic material remains in the first trench, a second portion of the first metallic material remains in the second trench, and the first metallic material is removed from a top surface of the one or more dielectric layers.

In an embodiment, the method further includes forming a second dielectric layer over the one or more dielectric layers and over the first and the second portions of the first metallic material; forming a second etch mask over the second dielectric layer, wherein the second etch mask defines a third hole above the first portion of the first metallic material and a fourth hole above the second portion of the first metallic material; etching the second dielectric layer through the third and the fourth holes to form a third trench and a fourth trench, respectively, in the second dielectric layer, wherein the third and the fourth trenches expose the first and the second portions of the first metallic material; and depositing a second metallic material into the third and the fourth trenches and above the second dielectric layer. In a further embodiment, the method includes performing another chemical mechanical planarization process to the second metallic material such that a first portion of the second metallic material remains in the third trench, a second portion of the second metallic material remains in the fourth trench, and the second metallic material is removed from a top surface of the second dielectric layer.

In an embodiment of the method, the second metal layer further includes dielectric features laterally between adjacent ones of the MTJ devices, and the etching of the one or more dielectric layers partially removes the dielectric features. In another embodiment of the method, the etching of the one or more dielectric layers partially removes the top electrode of at least one of the MTJ devices. In yet another embodiment of the method, the etching of the one or more dielectric layers completely removes the top electrode of at least one of the MTJ devices.

In yet another example aspect, the present disclosure is directed to a method that includes providing a structure having a first metal layer and a second metal layer disposed over the first metal layer, wherein the second metal layer includes multiple magnetic tunneling junction (MTJ) devices in a memory device region and a first conductive feature in a logic device region, wherein each of the MTJ devices includes a bottom electrode, an MTJ stack disposed over the bottom electrode, and a top electrode disposed over the MTJ stack. The method further includes forming a first dielectric layer over the second metal layer and a second dielectric layer over the first dielectric layer; forming a first trench and a second trench in the first dielectric layer, wherein the first trench exposes the first conductive feature and the second trench exposes a portion of each of the MTJ devices; forming a third trench and a fourth trench in the second dielectric layer, wherein the third trench is directly above the first conductive feature and the fourth trench is directly above the MTJ devices; depositing a first metallic material into the first, the second, the third, and the fourth trenches and above the second dielectric layer; and performing a chemical mechanical planarization process to the first metallic material such that a first portion of the first metallic material remains in the first and the third trenches, a second portion of the first metallic material remains in the second and the fourth trenches, and the first metallic material is removed from a top surface of the second dielectric layer.

In an embodiment of the method, the second metal layer further includes dielectric features laterally between adjacent ones of the MTJ devices, and the forming of the first trench and the second trench partially removes the dielectric features. In another embodiment of the method, the forming of the first trench and the second trench is performed after the forming of the third trench and the fourth trench. In another embodiment of the method, the forming of the first trench and the second trench partially removes the top electrode of at least one of the MTJ devices. In yet another embodiment of the method, the forming of the first trench and the second trench completely removes the top electrode of at least one of the MTJ devices.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
providing a structure having a first metal layer and a second metal layer disposed over the first metal layer, wherein the second metal layer includes multiple magnetic tunneling junction (MTJ) devices in a memory device region and a first conductive feature in a logic device region, wherein each of the MTJ devices includes a bottom electrode, an MTJ stack disposed over the bottom electrode, and a top electrode disposed over the MTJ stack;
forming one or more dielectric layers over the second metal layer;
forming a first etch mask over the one or more dielectric layers, wherein the first etch mask defines a first hole above the first conductive feature and a second hole above the MTJ devices and extending continuously from a first one of the MTJ devices to a last one of the MTJ devices;
etching the one or more dielectric layers through the first and the second holes to form a first trench and a second trench, respectively, in the one or more dielectric layers, wherein the first trench exposes the first conductive feature and the second trench exposes a portion of each of the MTJ devices, wherein the second metal layer further includes dielectric features laterally between adjacent ones of the MTJ devices, and the etching of the one or more dielectric layers partially removes the dielectric features;
depositing a first metallic material into the first and the second trenches and above the one or more dielectric layers; and
performing a chemical mechanical planarization process to the first metallic material such that a first portion of the first metallic material remains in the first trench, a second portion of the first metallic material remains in the second trench, and the first metallic material is removed from a top surface of the one or more dielectric layers.

2. The method of claim 1, wherein the depositing the first metallic material into the first and the second trenches and above the one or more dielectric layers includes depositing a copper material that fills the first and the second trenches.

3. The method of claim 1, wherein the etching of the one or more dielectric layers partially removes the top electrode of at least one of the MTJ devices.

4. The method of claim 1, wherein the etching of the one or more dielectric layers completely removes the top electrode of at least one of the MTJ devices.

5. The method of claim 1, further comprising:
forming a second dielectric layer over the one or more dielectric layers and over the first and the second portions of the first metallic material;
forming a second etch mask over the second dielectric layer, wherein the second etch mask defines a third hole above the first portion of the first metallic material and a fourth hole above the second portion of the first metallic material;
etching the second dielectric layer through the third and the fourth holes to form a third trench and a fourth trench, respectively, in the second dielectric layer, wherein the third and the fourth trenches expose the first and the second portions of the first metallic material; and
depositing a second metallic material into the third and the fourth trenches and above the second dielectric layer.

6. The method of claim 5, further comprising performing another chemical mechanical planarization process to the second metallic material such that a first portion of the second metallic material remains in the third trench, a second portion of the second metallic material remains in the fourth trench, and the second metallic material is removed from a top surface of the second dielectric layer.

7. A method, comprising:
providing a structure having a first metal layer and a second metal layer disposed over the first metal layer, wherein the second metal layer includes multiple magnetic tunneling junction (MTJ) devices in a memory device region and a first conductive feature in a logic device region, wherein each of the MTJ devices includes a bottom electrode, an MTJ stack disposed over the bottom electrode, and a top electrode disposed over the MTJ stack;
forming a first dielectric layer over the second metal layer and a second dielectric layer over the first dielectric layer;
forming a first trench and a second trench in the first dielectric layer, wherein the first trench exposes the first conductive feature and the second trench exposes a portion of each of the MTJ devices;
forming a third trench and a fourth trench in the second dielectric layer, wherein the third trench is directly above the first conductive feature and the fourth trench is directly above the MTJ devices, wherein the forming of the first trench and the second trench is performed after the forming of the third trench and the fourth trench;
depositing a first metallic material into the first, the second, the third, and the fourth trenches and above the second dielectric layer; and
performing a chemical mechanical planarization process to the first metallic material such that a first portion of the first metallic material remains in the first and the third trenches, a second portion of the first metallic material remains in the second and the fourth trenches, and the first metallic material is removed from a top surface of the second dielectric layer.

8. The method of claim 7, wherein the second metal layer further includes dielectric features laterally between adjacent ones of the MTJ devices, and the forming of the first trench and the second trench partially removes the dielectric features.

9. The method of claim 7, wherein the depositing the first metallic material into the first, the second, the third, and the fourth trenches and above the second dielectric layer includes depositing copper.

10. The method of claim 7, wherein the forming of the first trench and the second trench partially removes the top electrode of at least one of the MTJ devices.

11. The method of claim 7, wherein the forming of the first trench and the second trench completely removes the top electrode of at least one of the MTJ devices.

12. A method of forming a semiconductor structure, comprising:
depositing a first metal layer on a substrate;
depositing a second metal layer over the first metal layer;
using the second metal layer, forming multiple magnetic tunneling junction (MTJ) devices in a memory device region and a first conductive feature in a logic device region, wherein each of the MTJ devices includes a bottom electrode and an MTJ stack disposed over the bottom electrode; and
depositing a third metal layer immediately above the second metal layer,
using the third metal layer, forming a first via disposed over and electrically connecting to the first conductive feature, and a slot via disposed over the MTJ devices and electrically connecting to the MTJ stack of each of the MTJ devices, wherein the slot via occupies a space extending continuously and laterally from a first one of the MTJ devices to a last one of the MTJ devices, wherein a first thickness of the first via is equal to or less than a second thickness of the slot via directly above the MTJ stack of one of the MTJ devices, wherein the third metal layer further includes a second conductive feature disposed over and electrically connecting to the first via, and a third conductive feature disposed over and electrically connecting to the slot via.

13. The method of claim 12, further comprising:
form a top electrode on one of the MTJ devices, the top electrode vertically between the slot via and the MTJ stack of the one of the MTJ devices.

14. The method of claim 12, wherein a portion of the slot via extends to a level lower than a top surface of the MTJ stack of one of the MTJ devices.

15. The method of claim 12, wherein both the slot via and the first via include copper.

16. The method of claim 15, wherein both the second and the third conductive features include copper.

17. The method of claim 12, wherein the second metal layer includes a dielectric feature laterally disposed between two adjacent ones of the MTJ devices, and a third thickness of the slot via directly above the dielectric feature is greater than the second thickness.

18. The method of claim 17, wherein the third thickness is greater than the second thickness by about 5 nm to about 50 nm.

19. The method of claim 12, further comprising:
for each of the MTJ devices, forming a spacer on sidewalls of the MTJ stack of the respective MTJ device, and a protection layer on sidewalls of the spacer, wherein a portion of the slot via is disposed in a space laterally between the protection layer of two adjacent ones of the MTJ devices.

20. The method of claim 19, wherein a bottom surface of the portion of the slot via is substantially flat.

* * * * *